United States Patent
Kim et al.

(10) Patent No.: US 10,008,600 B2
(45) Date of Patent: Jun. 26, 2018

(54) SEMICONDUCTOR DEVICE HAVING SILICON-GERMANIUM SOURCE/DRAIN REGIONS WITH VARYING GERMANIUM CONCENTRATIONS

(71) Applicant: Samsung Electronics Co., Ltd., Suwon-si (KR)

(72) Inventors: Nam Kyu Kim, Yongin-si (KR); Dong Chan Suh, Yongin-si (KR); Kwan Heum Lee, Suwon-si (KR); Byeong Chan Lee, Yongin-si (KR); Cho Eun Lee, Pocheon-si (KR); Su Jin Jung, Hwaseong-si (KR); Gyeom Kim, Hwaseong-si (KR); Ji Eon Yoon, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/685,459

(22) Filed: Aug. 24, 2017

(65) Prior Publication Data
US 2017/0352759 A1  Dec. 7, 2017

Related U.S. Application Data

(63) Continuation of application No. 14/741,454, filed on Jun. 17, 2015, now Pat. No. 9,761,719.

(30) Foreign Application Priority Data

Jul. 22, 2014 (KR) .................. 10-2014-0092504

(51) Int. Cl.
*H01L 29/08* (2006.01)
*H01L 29/78* (2006.01)
(Continued)

(52) U.S. Cl.
CPC ...... *H01L 29/7848* (2013.01); *H01L 29/0847* (2013.01); *H01L 29/165* (2013.01); *H01L 29/41766* (2013.01); *H01L 29/7834* (2013.01)

(58) Field of Classification Search
CPC ..................................................... H01L 29/78
(Continued)

(56) References Cited

U.S. PATENT DOCUMENTS

| | | | |
|---|---|---|---|
| 6,724,008 B2 | 4/2004 | Fitzergald | |
| 6,724,019 B2 | 4/2004 | Oda et al. | |

(Continued)

FOREIGN PATENT DOCUMENTS

JP     2009-043938 A     2/2009

*Primary Examiner* — Caleb Henry
(74) *Attorney, Agent, or Firm* — Muir Patent Law, PLLC

(57) ABSTRACT

A semiconductor device may include: a semiconductor substrate, a device isolating layer embedded within the semiconductor substrate and defining an active region, a channel region formed in the active region, a gate electrode disposed above the channel region, a gate insulating layer provided between the channel region and the gate electrode, and a silicon germanium epitaxial layer adjacent to the channel region within the active region and including a first epitaxial layer containing a first concentration of germanium, a second epitaxial layer containing a second concentration of germanium, higher than the first concentration, and a third epitaxial layer containing a third concentration of germanium, lower than the second concentration, the first to third epitaxial layers being sequentially stacked on one another in that order.

17 Claims, 36 Drawing Sheets

(51) Int. Cl.
  *H01L 29/165* (2006.01)
  *H01L 29/417* (2006.01)

(58) Field of Classification Search
  USPC .......................................................... 257/40
  See application file for complete search history.

(56) References Cited

U.S. PATENT DOCUMENTS

| | | |
|---|---|---|
| 7,439,142 B2 | 10/2008 | Samoilov et al. |
| 7,759,199 B2 | 7/2010 | Thomas et al. |
| 7,884,353 B2 | 2/2011 | Currie et al. |
| 7,989,901 B2 | 8/2011 | Lin et al. |
| 8,232,191 B2 | 7/2012 | Fukuda et al. |
| 8,367,528 B2 | 2/2013 | Bauer et al. |
| 8,623,728 B2 | 1/2014 | Chang et al. |
| 8,633,516 B1 | 1/2014 | Wu et al. |
| 9,142,642 B2 | 9/2015 | Chen et al. |
| 2008/0185612 A1 | 8/2008 | Fukuda et al. |
| 2009/0152590 A1 | 6/2009 | Adam et al. |
| 2009/0246921 A1 | 10/2009 | Cheng et al. |
| 2012/0001228 A1 | 1/2012 | Chong et al. |
| 2012/0153387 A1 | 6/2012 | Murthy et al. |
| 2012/0241765 A1 | 9/2012 | Cheng et al. |
| 2013/0069172 A1 | 3/2013 | Liao et al. |
| 2013/0207166 A1 | 8/2013 | Chen et al. |
| 2015/0014788 A1 | 1/2015 | Park et al. |
| 2016/0013316 A1 | 1/2016 | Kuang et al. |

A - A'

B - B'

B - B'

D - D'

A − A'

C - C'

SEMICONDUCTOR DEVICE HAVING SILICON-GERMANIUM SOURCE/DRAIN REGIONS WITH VARYING GERMANIUM CONCENTRATIONS

CROSS-REFERENCE TO RELATED APPLICATION

This application is a continuation of U.S. patent application Ser. No. 14/741,454 filed on Jun. 17, 2015, which claims priority to Korean Patent Application No. 10-2014-0092504 filed on Jul. 22, 2014, with the Korean Intellectual Property Office, the entire contents of each of these applications being hereby incorporated herein by reference.

BACKGROUND

Example embodiments in the present disclosure relate to a semiconductor device.

Sizes of complementary metal-oxide-semiconductor (CMOS) field effect transistors (FETs) have been gradually decreased in accordance with demand for high density and high performance thereof. However, due to an increase in consequent short-channel effects, it may be difficult to improve functions of the transistor according to the decrease in transistor size. In order to produce high-performance metal-oxide-semiconductor (MOS) field effect transistors, methods of increasing degrees of mobility of electrons and holes have been developed along with the development of methods for reducing contact resistance and resistance in source and drain regions.

SUMMARY

An example embodiment in the present disclosure may provide a highly functional p-type metal oxide semiconductor (PMOS) field effect transistor (FET) having an embedded silicon germanium SiGe (eSiGe) stressor containing a high density of germanium (Ge).

According to an example embodiment in the present disclosure, a semiconductor device may include: a semiconductor substrate having an active region defined therein and including a channel region; a gate electrode disposed above the channel region; a gate insulating layer provided between the channel region and the gate electrode; and a silicon germanium epitaxial layer adjacent to the channel region within the active region and including a first epitaxial layer containing a first concentration of germanium, a second epitaxial layer containing a second concentration of germanium, higher than the first concentration, and a third epitaxial layer containing a third concentration of germanium, lower than the second concentration, the first to third epitaxial layers being sequentially stacked on one another.

The silicon germanium epitaxial layer may further include a buffer epitaxial layer having a germanium concentration lower than the first concentration, in the stack below the first epitaxial layer.

The germanium concentration of the buffer epitaxial layer may be in a range of 10 at % (atomic percent) to 25 at %.

The first concentration may be in a range of 25 at % to 50 at %, the second concentration may be in a range of 50 at % to 90 at %, and the third concentration may be in a range of 25 at % to 50 at %. The first epitaxial layer may also be comprised of a concentration gradient where the buffer epitaxial layer is not present in which the germanium concentration increases in an upward direction and wherein the concentration gradient may be within a range of 10 at % to 50 at %.

A silicon capping layer and an etch stopping layer may be sequentially disposed on the silicon germanium epitaxial layer.

The semiconductor device may further include a contact plug disposed on the silicon germanium epitaxial layer, the contact plug being extended into the silicon capping layer or the third epitaxial layer. A bottom portion of the contact plug may have a serrated shape that corresponds to an upper portion of the silicon germanium epitaxial layers.

The semiconductor device may further include a metal silicide layer disposed between the silicon germanium epitaxial layer and the contact plug and positioned in an upper portion of the second epitaxial layer. The semiconductor device may further include three interfacial layers, each of which may be disposed between two of the four epitaxial layers. In other words the first interfacial layer may be disposed between the buffer epitaxial layer and the first epitaxial layer, the second interfacial layer may be disposed between the first and second epitaxial layers, and the third interfacial layer may be disposed between the second and third epitaxial layers.

The silicon germanium epitaxial layer may be doped with a p-type impurity and a concentration of the p-type impurity may be varied in proportion to the concentration of germanium. The semiconductor device may also contain multiple silicon germanium epitaxial layers that are formed adjacent to each other and wherein at least a portion of the silicon germanium epitaxial layers of each may connect to each other. The first concentration may be between one and five times greater than the germanium concentration of the buffer epitaxial layer. The second concentration may be between one and four times greater than each of the first and third concentrations and between two and ten times greater than the germanium concentration of the buffer epitaxial layer. The first and third concentrations may be different.

The active region may include a recessed region in a location corresponding to both sides of the gate electrode, and the silicon germanium epitaxial layer may be formed in the recessed region of the active region. The buffer, first, second, and third epitaxial layers may be formed to have a curved, concave shape.

The active region may include a plurality of active regions, and a device isolating layer may be provided to fill a space between the plurality of active regions to a predetermined height, and a width of the active region may be reduced in an upward direction and an upper portion of the active region may protrude upwardly above the device isolating layer.

The gate electrode may be extended to cross the active region and cover the upper portion of the active region protruding upwardly above the device isolating layer.

The gate insulating layer may include at least one high-k dielectric layer and the gate electrode may at least be comprised of one of metal silicide and a metal. The gate electrode may also be comprised of a first, inner portion, and a second, outer portion.

The semiconductor substrate may be a silicon substrate or a silicon-on-insulator (SOI) substrate, and the active region may be doped with an n-type impurity. A silicon germanium layer may be further provided between an insulating layer and an SOI layer.

According to an example embodiment in the present disclosure, a semiconductor device may include an active fin, including a channel region, and be doped with an n-type impurity; a gate electrode disposed above the channel region and crossing the active fin; a gate insulating layer provided between the channel region and the gate electrode; and a silicon germanium epitaxial layer adjacent to the channel region within the active fin and doped with a p-type impurity, wherein the silicon germanium epitaxial layer includes a first epitaxial layer containing a first concentration of germanium, a second epitaxial layer containing a second concentration of germanium, higher than the first concentration, and a third epitaxial layer containing a third concentration of germanium, lower than the second concentration, the first to third epitaxial layers being sequentially stacked on one another.

The silicon germanium epitaxial layer may further include a buffer epitaxial layer having a germanium concentration lower than the first concentration, stacked below the first epitaxial layer. In an example embodiment, the p-type impurity may be boron (B).

Methods of manufacturing the various different embodiments of a semiconductor device containing one or more of the features describe herein are also disclosed. Such manufacturing methods may include the doping of the p-type impurity at a high concentration through an ion implantation process, using, as a buffer layer, the silicon capping layer formed on the silicon germanium epitaxial layer after the growth of the silicon germanium epitaxial layer is completed. Some of the manufacturing methods may also include forming a device-isolating trench to define the active regions, the active regions themselves with their active fins in the upper portions, the plurality of inner epitaxial layers within the silicon germanium epitaxial layers, and the silicon capping layer with an etch stopping layer formed atop it.

BRIEF DESCRIPTION OF DRAWINGS

The above disclosure and other aspects, features and advantages of the present disclosure will be more clearly understood from the following detailed description provided in conjunction with the accompanying drawings, in which.

DETAILED DESCRIPTION

Figure 1:
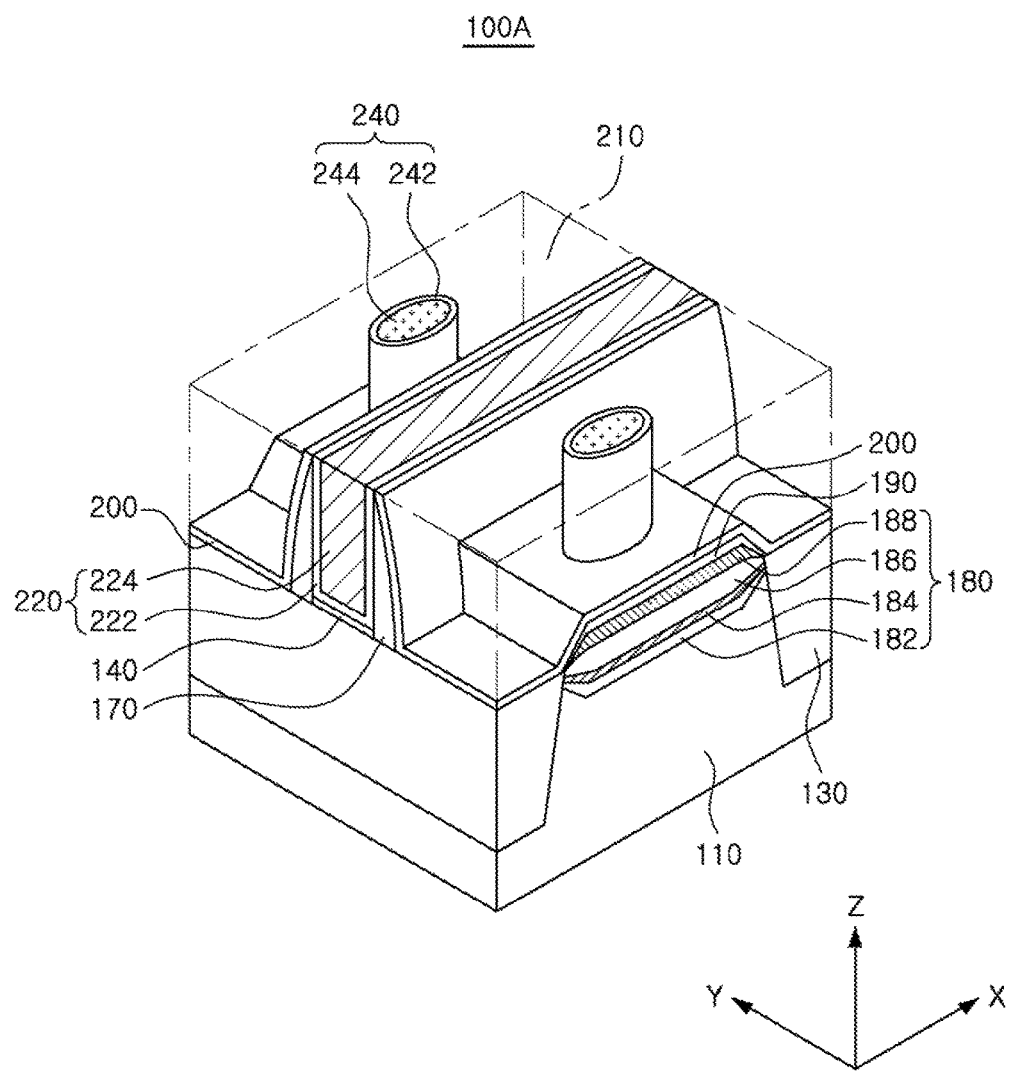
FIG. 1 is a schematic perspective view of a semiconductor device according to an example embodiment of the present disclosure.

Example embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Terms such as "between" and "adjacent" should be treated similarly. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the drawings, the shapes and dimensions of elements may be exaggerated for clarity, and the same reference numerals will be used throughout to designate the same or like elements.

Figure 2:
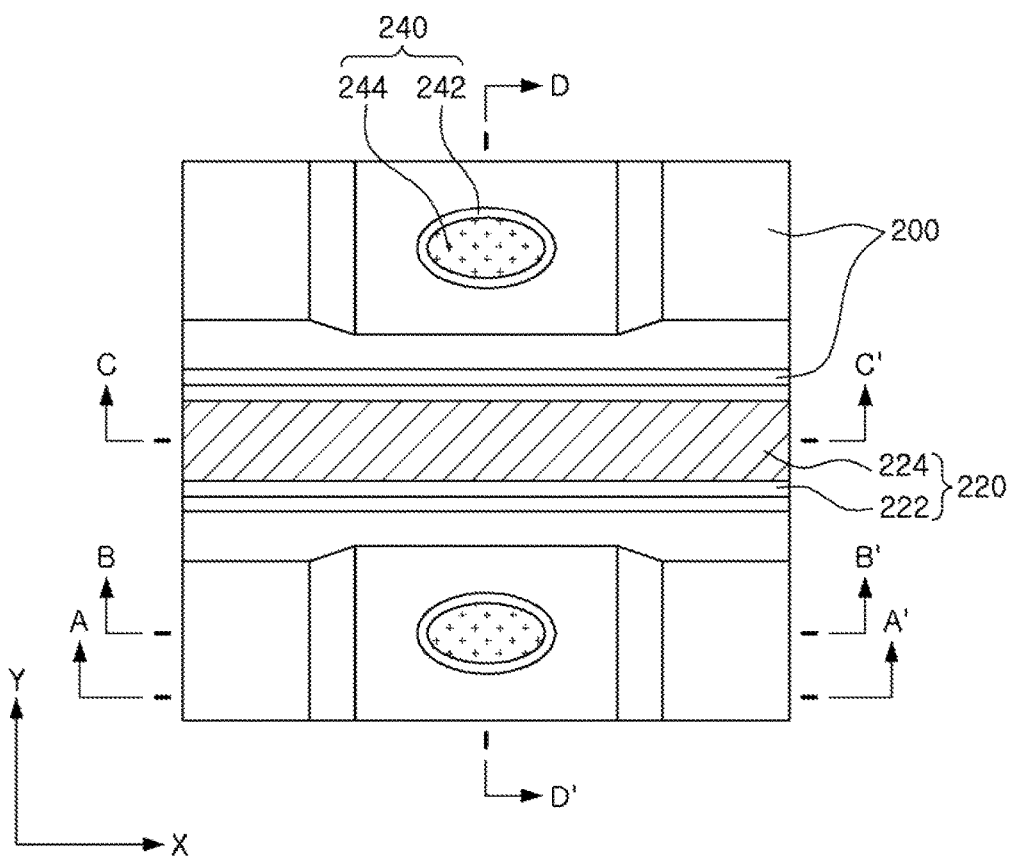
FIG. 2 is a plan view of the semiconductor device illustrated in FIG. 1.

FIG. 1 is a schematic perspective view of a semiconductor device according to an example embodiment of the present disclosure. FIG. 2 is a plan view of the semiconductor device illustrated in FIG. 1. FIGS. 3A through 3D are cross-sectional views of the semiconductor device illustrated in FIG. 1, cut in certain directions. In particular, FIGS. 3A through 3D are cross-sectional views of the semiconductor device illustrated in FIGS. 1 and 2, taken along line A-A', line B-B', line C-C', and line D-D', respectively.

Referring to FIG. 1 and FIGS. 3A through 3D, a semiconductor device 100A according to an example embodiment of the present disclosure may include a semiconductor substrate 110 having an active region ACT defined by a device isolating layer 130, gate electrodes 220 disposed to cross the active region ACT, a gate insulating layer 140 disposed below the gate electrodes 220, spacers 170 disposed on both sidewalls of the gate electrodes 220, a source region SR and a drain region DR disposed in locations within the active region ACT and on either side of the gate electrodes 220 and doped with an impurity, and a channel region CHR disposed between the source region SR and the drain region DR within the active region ACT and positioned below the gate insulating layer 140. In addition, the semiconductor device 100A, according to an example embodiment of the present disclosure, may include a silicon germanium (SiGe) epitaxial layer 180 disposed in at least portions of the source region SR and the drain region DR and having an upper surface elevated to a position higher than an upper surface of the active region ACT, a silicon capping layer 190 disposed on the silicon germanium epitaxial layer 180, an etch stopping layer 200 and an interlayer insulating layer 210 disposed on the gate electrodes 220, the device isolating layer 130, and the silicon capping layer 190, and contact plugs 240 connected to the silicon germanium epitaxial layer 180.

In an example embodiment of the present disclosure, the semiconductor substrate 110 may be a monocrystalline silicon substrate doped with an n-type impurity. Alternatively, the semiconductor substrate 110 may a region of a monocrystalline silicon wafer, doped with an n-type impurity. The device isolating layer 130 may be formed of at least one from among, for example, a Borophosphosilicate glass (BPSG) layer, a High Density Plasma (HDP) layer, a Flowable Oxide (FOX) layer, a Tonen SilaZene (TOSZ) layer, a Spin On Glass (SOG) layer, an Undoped Silica Glass (USG) layer, a Tetraethylorthosilicate (TEOS) layer, and a Low Temperature Oxide (LTO) layer.

The gate insulating layer 140 may include at least one from among, for example, a silicon oxide layer, a silicon oxynitride layer, a silicon nitride layer, and a high-k dielectric layer, and may be configured as a plurality of layers. The high-k dielectric layer may be comprised of an insulating material having a dielectric constant higher than that of the silicon oxide layer and may be formed of at least one from among, for example, a tantalum oxide layer, a titanium oxide layer, a hafnium oxide layer, a zirconium oxide layer, an aluminum oxide layer, a yttrium oxide layer, a niobium oxide layer, hafnium silicate, and zirconium silicate. The high-k dielectric preferably may have a dielectric constant of 6 or greater. Alternatively, the high-k dielectric may have a dielectric constant of 8 or greater, larger than 10.

The gate electrodes 220 may include a first gate electrode 222 and a second gate electrode 224. The first gate electrode 222 may be formed of a metal nitride. For example, the first gate electrode 222 may be formed of at least one of titanium nitride (TiN), tantalum nitride (TaN), tungsten nitride (WN) and the like. The second gate electrode 224 may be formed of a metal. For example, the second gate electrode 224 may be formed of at least one of aluminum (Al), tungsten (W), molybdenum (Mo) and the like. The first gate electrode 222 may serve as a diffusion barrier layer for the metal forming the second gate electrode 224.

The etch stopping layer 200 may be a silicon nitride layer or a silicon oxynitride layer, and the interlayer insulating layer 210 may be formed of a silicon oxide layer, Tetraethylorthosilicate (TEOS), Undoped Silicate Glass (USG), Phosphosilicate Glass (PSG), Borosilicate Glass (BSG), Borophosphosilicate Glass (BPSG), Fluoride Silicate Glass (FSG), Spin On Glass (SOG), Tonen Silazene (TOSZ), or combinations thereof.

Figure 3A:
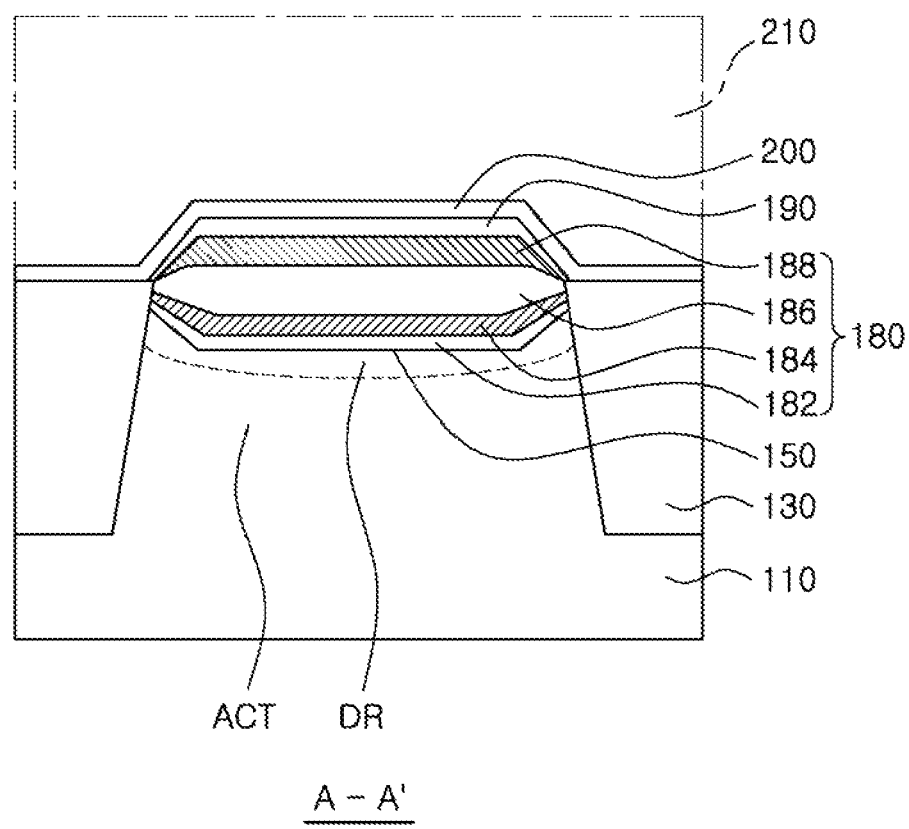
FIGS. 3A through 3D are cross-sectional views of the semiconductor device illustrated in FIG. 1, cut in certain directions.

Referring to FIG. 3A, the silicon germanium epitaxial layer 180 will be described in detail. With reference to FIG. 3, descriptions are made on the basis of the drain region DR in the example embodiment but it will be understood that the source region SR may also have the same structure as the drain region DR. It will also be understood that the drain region DR may be the source region SR and that the drain region DR may be the source region SR depending on the operation of the device and that each of the described source region SR and drain region DR may be considered a source/drain (S/D) region.

The drain region DR, denoted by a dotted line, may be an impurity region doped with an impurity at a high-concentration within the active region ACT. In this example, the silicon germanium epitaxial layer 180 disposed in a recessed region 150 inside the drain region DR may include four layers or four regions having different germanium concentrations. However, the silicon germanium epitaxial layer 180 may have more or less layers than 4.

The recessed region 150 may be formed by removing at a portion of the semiconductor substrate 110 at the drain region DR. A buffer epitaxial layer 182 may be disposed as the lowermost portion of the silicon germanium epitaxial layer 180 within the recessed region 150. A first epitaxial layer 184, a second epitaxial layer 186, and a third epitaxial layer 188 may be sequentially disposed on the buffer epitaxial layer 182. The buffer epitaxial layer 182 and first, second and third epitaxial layers 184, 186 and 288 may be formed in-situ (e.g., in the same process chamber, such as by epitaxially growing these layers in the same process chamber sealed from the external atmosphere (e.g., without a vacuum break))). A bottom surface of the recessed region 150 may be a horizontal surface and be defined by a surface of the semiconductor substrate 110. Side surfaces of the recessed region 150 adjacent to the device isolating layer 130 may be inclined with respect to the bottom horizontal surface of the recessed region 150. The upper surface of the silicon germanium epitaxial layer 180 may be disposed in a position higher than an upper surface of the active region ACT, such as higher than the active region ACT under gate electrode 220 and higher than the uppermost portions of the semiconductor substrate 110. Such elevated source and drain structures increase cross-sectional areas of the source and drain regions, whereby resistance in the source and drain regions may be reduced.

The buffer epitaxial layer 182 may have a minimum germanium (Ge) concentration, while the second epitaxial layer 186 may have a maximum germanium concentration. In this example, the germanium concentration of the buffer epitaxial layer 182 may be in a range of 10 at % (atomic percent) to 25 at %, the germanium concentration of the first epitaxial layer 184 may be in a range of 25 at % to 50 at %, the germanium concentration of the second epitaxial layer 186 may be in a range of 50 at % to 90 at %, and the germanium concentration of the third epitaxial layer 188 may be in a range of 25 at % to 50 at %. For example, the germanium concentration of the first epitaxial layer 184 may be up to five times greater than the germanium concentration of the buffer epitaxial layer 182 and the germanium concentration of the second epitaxial layer 186 may be up to about four times greater than the germanium concentration of each of the first and third epitaxial layers 184 and 188 and up to about 10 times greater than the germanium concentration of the buffer epitaxial layer. The germanium concentration of the first and third epitaxial layers 184 and 188 may be the same or different. The buffer epitaxial layer 182 may reduce a lattice mismatch between the first epitaxial layer 184 and the active region ACT formed of silicon, thereby decreasing the formation of lattice defects in the silicon germanium epitaxial layer 180. Thicknesses of the respective epitaxial layers 182, 184, 186, and 188 may be different. For example, the second epitaxial layer 186, having a range that would result in the greatest germanium concentration of the four epitaxial layers and accordingly causing the highest compressive strain in the channel region CHR, may have a greater thickness.

The silicon germanium epitaxial layer 180 may be doped with a p-type impurity at a high concentration and may form at least portions of the source region and the drain region. The doping of the p-type impurity at a high concentration may be performed using an in-situ doping method where p-type impurity dopant atoms are introduced during the growth of the silicon germanium epitaxial layer 180. In other examples, the doping of the p-type impurity at a high concentration may be performed through an ion implantation process, using, as a buffer layer, the silicon capping layer 190 formed on the silicon germanium epitaxial layer 180 after the growth of the silicon germanium epitaxial layer 180 is completed. The concentration of the p-type impurity within the silicon germanium epitaxial layer 180 may be varied in proportion to the germanium (Ge) concentration, and for example, the second epitaxial layer 186 may have the highest concentration of the p-type impurity. In an example embodiment, the p-type impurity may be boron (B).

A capping layer 190 may be formed on the third epitaxial layer 188. For example, the capping layer 190 may be crystalline silicon epitaxially grown on the third epitaxial layer. The capping layer 190 may be epitaxially grown in-situ with the buffer and first through third epitaxial layers 182, 184, 186 and 188. The capping layer 190 may be intrinsic semiconductor (e.g., undoped silicon).

Figure 3B:
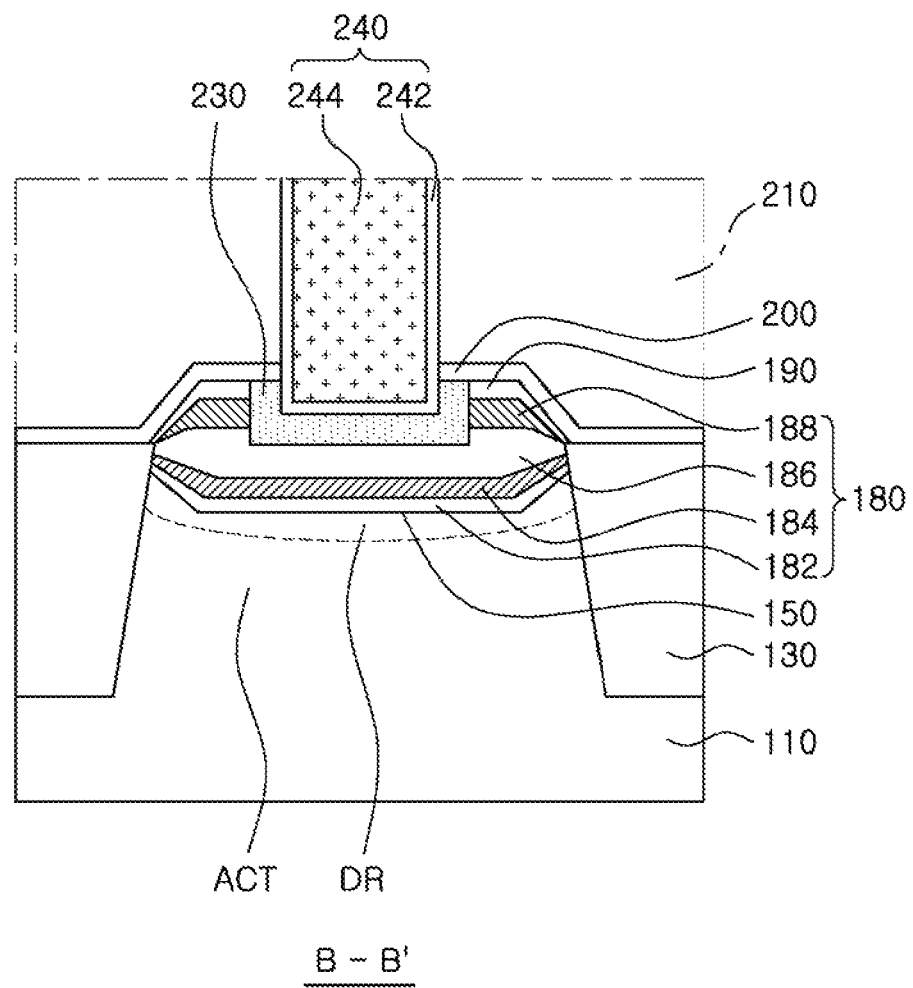
Figure 3C:
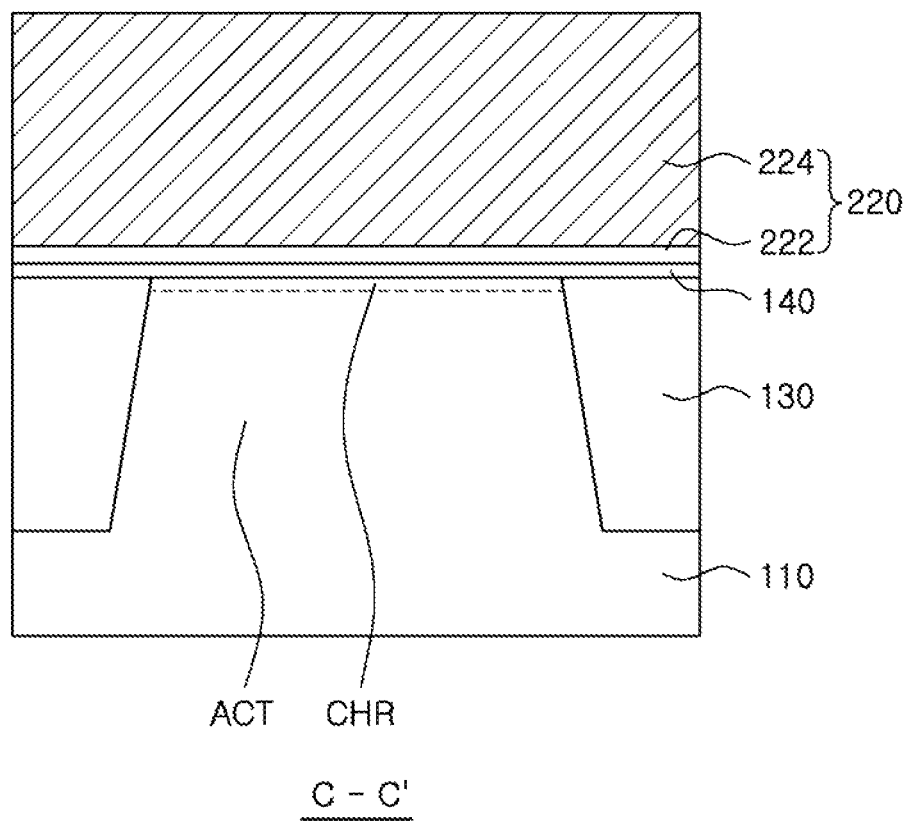
Figure 3D:
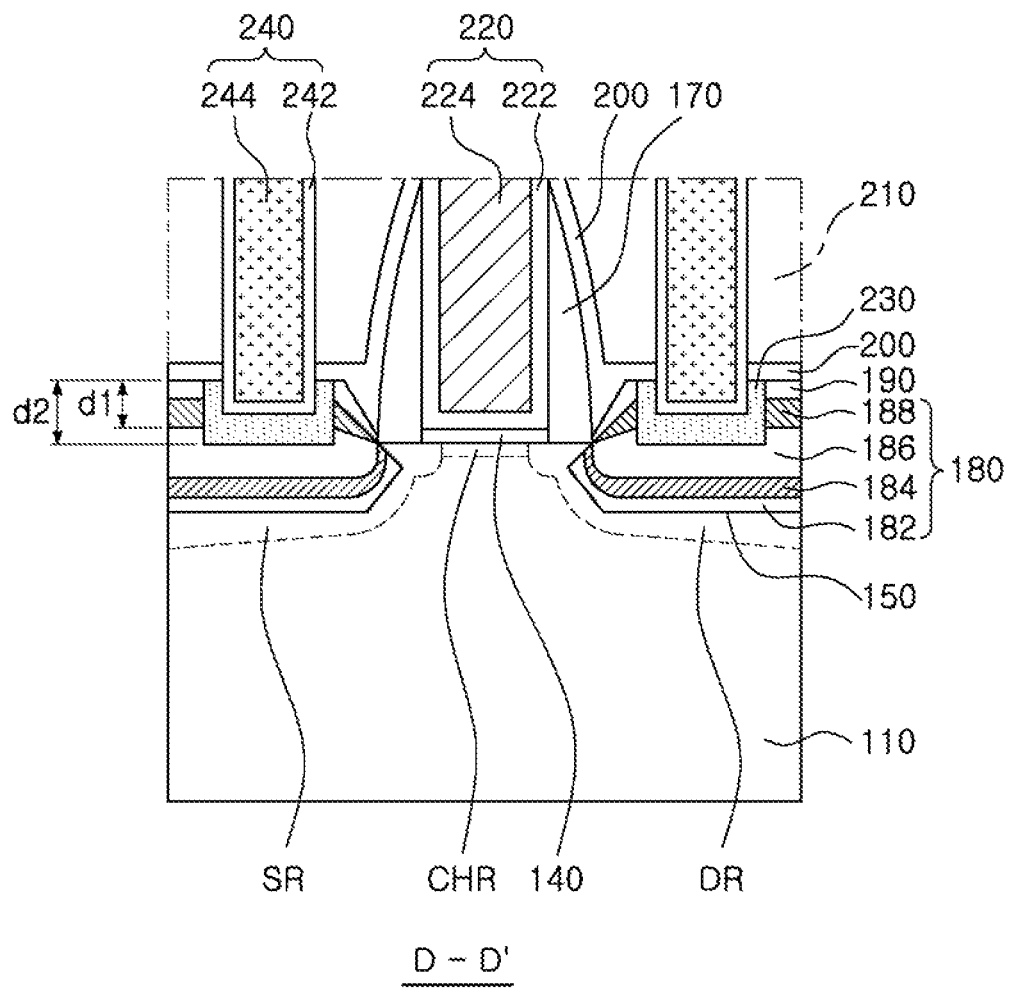

Referring to FIGS. 3B and 3D, the contact plugs 240 connected to the silicon germanium epitaxial layer 180 will be described in detail. The contact plugs 240 may include a first material 242 and a second material 244. The first material 242 may be formed of a metal nitride and line the bottom and sidewalls of the contact plug 240. For example, the first material 242 may be formed of at least one of titanium nitride (TiN), tantalum nitride (TaN), tungsten nitride (WN) and the like. The second material 244 may be formed of a metal. For example, the second material 244 may be formed of at least one of aluminum (Al), tungsten (W), molybdenum (Mo) and the like. The first material 242 may serve as a diffusion barrier layer for the metal forming second material 244.

A metal silicide layer 230 may be further disposed between the silicon germanium epitaxial layer 180 and the contact plugs 240. The metal silicide layer 230 may be formed of at least one from among, for example, nickel silicide, cobalt silicide, tungsten silicide, titanium silicide, tantalum silicide, niobium silicide, and the like.

The semiconductor device 100A may be a PMOS transistor and in the case of the PMOS transistor, when a degree of mobility of holes, major carriers, is increased in the channel region CHR, performance of the PMOS transistor may be improved. In addition, in an embodiment in which contact resistance or resistance in the source region and the drain region is decreased, the performance of the PMOS transistor may be improved. As a method of increasing a degree of mobility of holes in the channel region CHR, a scheme of disposing an embedded silicon germanium (eSiGe) epitaxial layer in portions of the source region and the drain region may be used. Since a lattice constant of germanium is greater than a lattice constant of silicon, a lattice constant of silicon-germanium may be greater than the lattice constant of silicon, and be lower than the lattice constant of germanium. Therefore, the embedded silicon germanium (eSiGe) epitaxial layer may cause uniaxial compressive strain in the channel region CHR of the PMOS transistor. As the germanium concentration is increased, a level of uniaxial compressive strain occurring in the channel region CHR may be further increased. Such uniaxial compressive strain may increase a degree of mobility of holes in the channel region CHR of the PMOS transistor.

In an example embodiment of the present disclosure, the contact plugs 240 may penetrate through the interlayer insulating layer 210 and be extended into the third epitaxial layer 188, and the metal silicide layer 230 may be disposed between the contact plugs 240 and the second epitaxial layer 186. The distance d2, shown in an example in FIG. 3D, from the upper surface of the silicon capping layer 190 to the lower portion of the metal silicide layer 230, may be greater than the distance d1 extending from the upper surface of the silicon capping layer 190 to the lower portion of the third epitaxial layer 188. Depending on example embodiments, the contact plugs 240 may extend through the silicon capping layer 190 and the metal silicide layer 230 may be formed within the third epitaxial layer 188 and come into contact with the second epitaxial layer 186. In some examples, distance d2 from an upper surface of the silicon capping layer 190 to a lower portion of the metal silicide layer 230 may be equal to a distance d1 from the upper surface of the silicon capping layer 190 to a lower portion of the third epitaxial layer 188. In some examples, the bottom surface of the metal silicide layer 230 may be substantially at the same level as the upper surface of the second epitaxial layer 186. In other examples, the bottom surface of the metal silicide layer 230 may be formed lower or higher than the upper surface of the second epitaxial layer (e.g., within second epitaxial layer 186 or within third epitaxial layer 188). As described above, the third epitaxial layer 188 may be disposed on the second epitaxial layer 186, whereby a loss to the second epitaxial layer 186, having the greatest germanium concentration due to a contact etching process and a metal silicide process, may be prevented. Therefore, the uniaxial compressive strain may be efficiently caused in the channel region CHR. In addition, since a Schottky contact may be formed in the second epitaxial layer 186 in which concentrations of the germanium (Ge) and p-type impurity (for example, boron (B)) are greatest, Schottky barrier height and width may be reduced, such that contact resistance may be decreased. Consequently, the performance of the PMOS transistor may be improved.

Figure 4A:
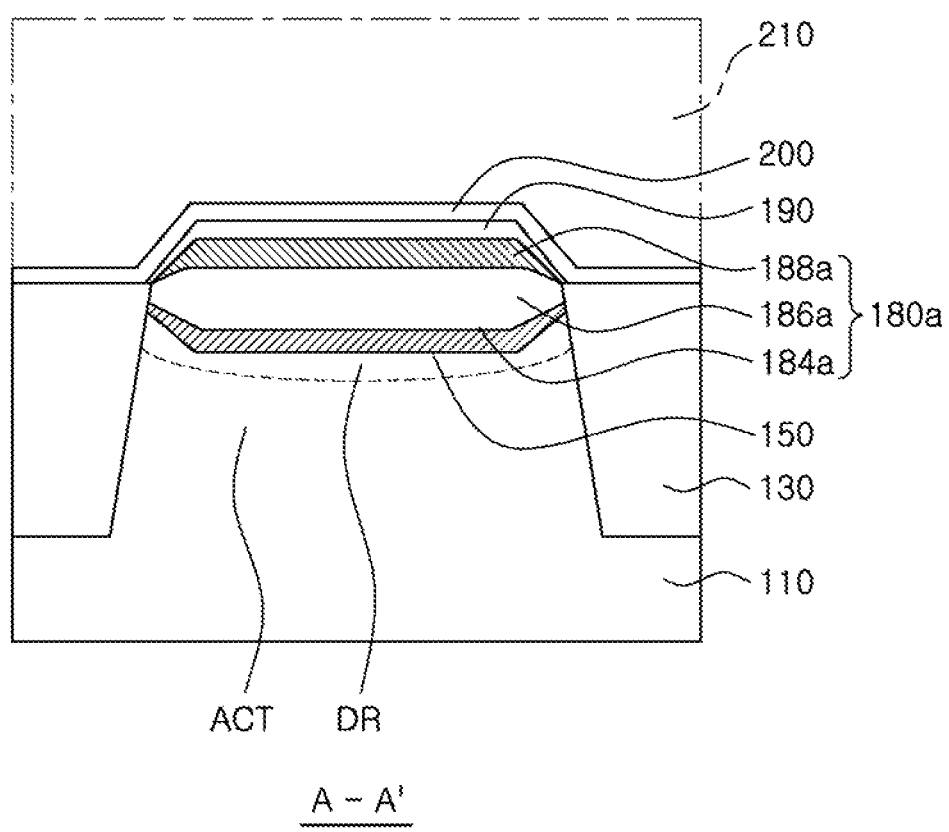
FIGS. 4A and 4B are cross-sectional views illustrating examples of a structure of the semiconductor device illustrated in FIG. 3A.
Figure 4B:
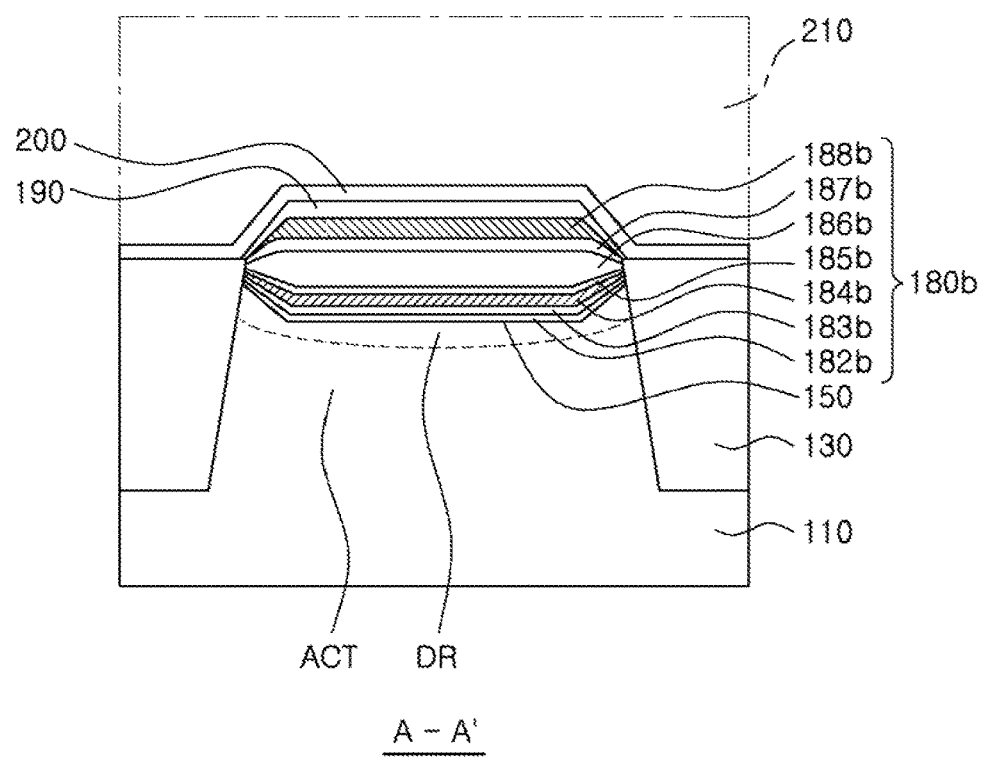

FIGS. 4A and 4B are cross-sectional views of the semiconductor device according to an example embodiment of the present disclosure. In detail, FIGS. 4A and 4B illustrate cross-sections of the semiconductor device corresponding to FIG. 3A.

Referring to FIG. 4A, a silicon germanium epitaxial layer 180a may include three layers having different germanium concentrations. A first epitaxial layer 184a may be disposed on a lowermost portion of the recessed region 150, and a second epitaxial layer 186a, having a greater germanium concentration than the other two epitaxial layers, and a third epitaxial layer 188a may be sequentially disposed on the first epitaxial layer 184a. Germanium concentrations of the second epitaxial layer 186a and the third epitaxial layer 188a may be respectively identical to germanium concentrations of the second epitaxial layer 186a and the third epitaxial layer 188a described with reference to FIG. 3A. The germanium concentration of the first epitaxial layer 184a may have a concentration gradient in which the germanium concentration increases in an upward direction of the first epitaxial layer 184a, and may be within a range of 10 at % (atomic percent) to 50 at %.

Referring to FIG. 4B, a silicon germanium epitaxial layer 180b may include four layers having different germanium concentrations and may further include three interfacial layers between the layers. The silicon germanium epitaxial layer 180b may further include a first interfacial layer 183b between the buffer epitaxial layer 182b and the first epitaxial layer 184b, a second interfacial layer 185b between the first epitaxial layer 184b and the second epitaxial layer 186b, and a third interfacial layer 187b between the second epitaxial layer 186b and the third epitaxial layer 188b. The germanium concentration of each interfacial layer may have a concentration gradient and be varied between germanium concentrations of upper and lower epitaxial layers thereof. In an alternative embodiment, one or all of the layers of the silicon germanium epitaxial layers (e.g., 180, 180a or 180b) may have a concentration gradient of germanium that varies from its upper and lower surfaces. For example, the silicon germanium epitaxial layer may continuously vary in its germanium concentration from its lower to upper surface (e.g., from a low concentration at its lower surface, to a maximum concentration at a middle location, and decreasing to an intermediate or low concentration at its upper surface). In this example, the germanium concentration (or average germanium concentration) of a portion of the silicon germanium epitaxial layer may correspond to those portions at the same relative location of those other exemplary silicon germanium epitaxial layers described elsewhere herein.

Figure 5A:
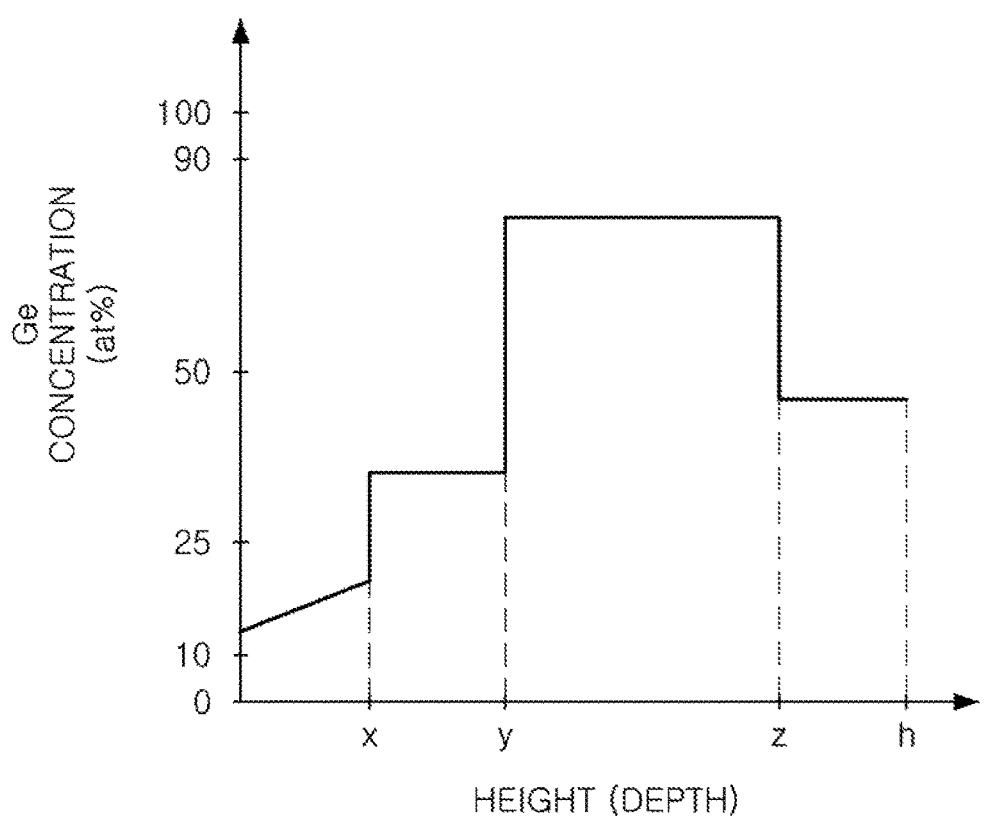
FIGS. 5A through 5C are graphs illustrating example concentration profiles at varying depths within an epitaxial source/drain region, according to example embodiments of the present disclosure.
Figure 5B:
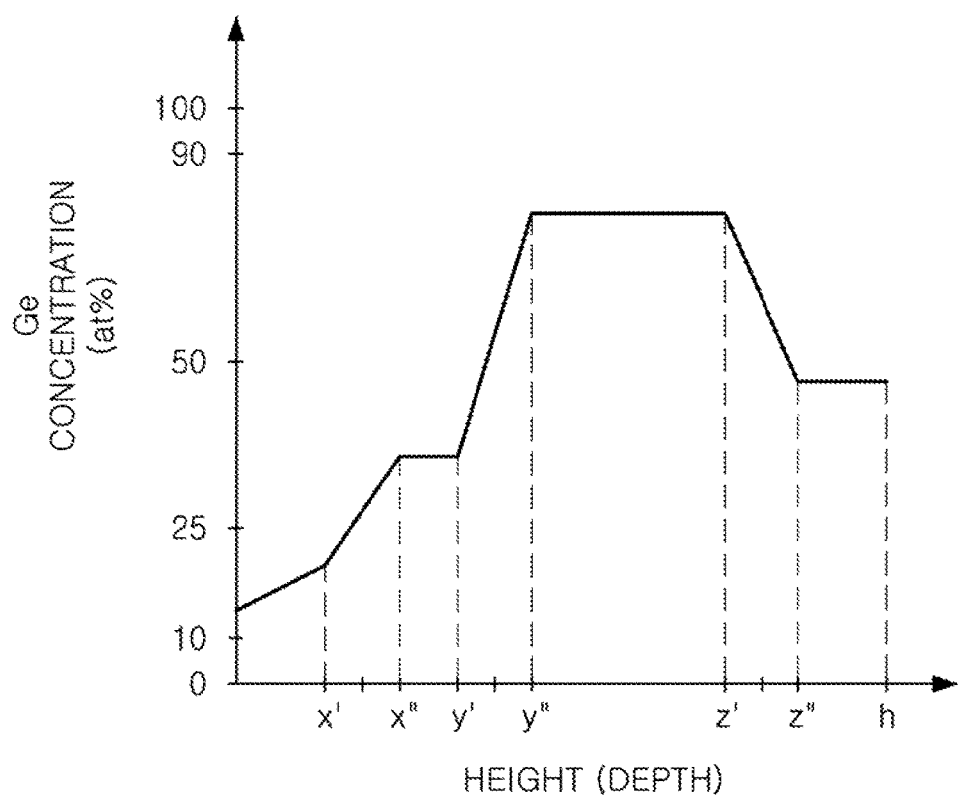
Figure 5C:
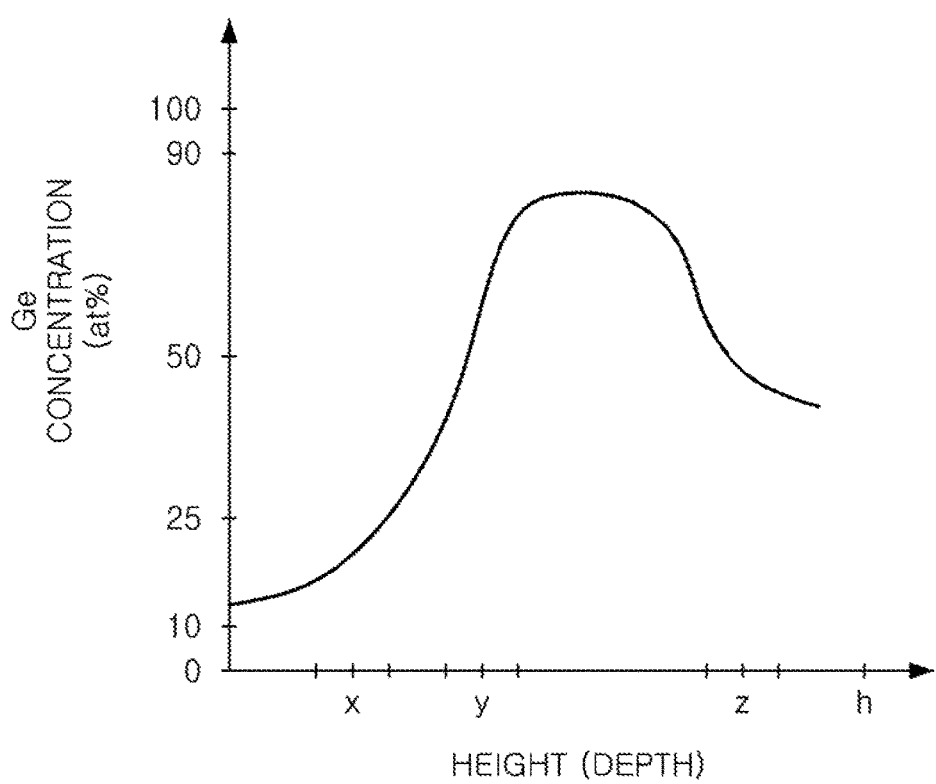
Figure 5D:
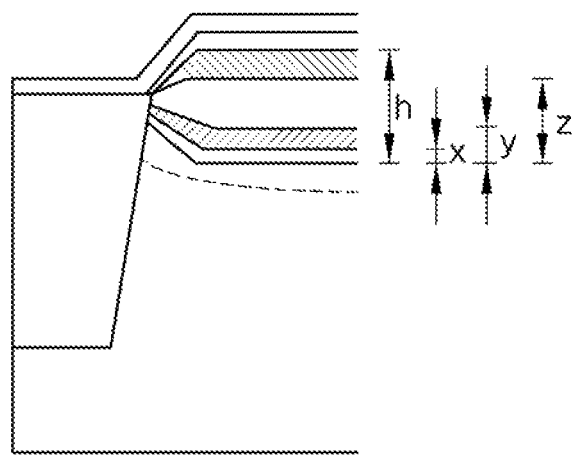
FIG. 5D illustrates exemplary heights in connection with FIGS. 5A and 5C.

FIGS. 5A through 5C are graphs illustrating several examples of germanium concentrations at varying heights (or depths) within the silicon germanium epitaxial layer, according to example embodiments of the present disclosure, and FIG. 5D illustrates heights used in FIGS. 5A and 5C.

Although FIGS. 5A to 5D refer to structure illustrated in FIG. 3A, this is just an example and their features are also applicable to other embodiments described herein. FIG. 5D depicts various heights that are used in the ensuing description. For example, x is illustrated as a height (or depth) from the top surface of the recessed region 150 (at the center of the recessed region) to a bottom surface of the first epitaxial layer 184, y is similarly a height from the top surface of the recessed region 150 to a bottom surface of the second epitaxial layer 186, and z is a height from the top surface of the recessed region 150 to a bottom surface of the third epitaxial layer 188. Height h may be a total height of the silicon germanium epitaxial layer, i.e. from the top surface of the recessed region 150 to a top surface of the third epitaxial layer 188. All of these heights are taken to be at the point of maximum thickness of the epitaxial layers within the silicon germanium epitaxial layer, but it will be understood that the this explanation may also be applicable to the shorter heights elsewhere in the respective.

Referring to FIG. 5A, in a range from the top surface of the recessed region 150 to a height "x" the germanium (Ge) concentration is shown, as disclosed above, for the buffer epitaxial layer 182 to be in the range of 10 at % to 25 at %. In this example, the germanium concentration increases linearly from the top surface of the recessed region 150 to the height x. Similarly, between height x and height y the Ge concentration of the first epitaxial layer 184 is shown to be in the range of 25 at % to 50 at %. Between height y and height z the Ge concentration of the second epitaxial layer is shown to be in the range of 50 at % to 90 at % and between height z and height h the Ge concentration of the third epitaxial layer is shown to be in the range of 25 at % to 50 at %.

FIG. 5B shows another example germanium concentration over various heights but pertaining specifically to the example embodiment disclosed with reference to FIG. 4B. In other words, FIG. 5B illustrates example germanium concentrations in layers within the silicon germanium epitaxial layer having interfacial layers disposed between the first through third epitaxial layers. Heights x', y', and z' are heights at bottom surfaces of the first, second, and third interfacial layers 183b, 185b, 187b, respectively, and heights x", y", and z" are heights at top surfaces of the first, second, and third interfacial layers 183b, 185b, 187b, respectively. FIG. 5B illustrates the germanium concentration of each interfacial layer between each of the four epitaxial layers having a concentration of germanium that changes with respect to height (e.g., linearly changes).

FIG. 5C is an example embodiment that shows average germanium concentrations of the buffer, first, second, and third epitaxial layers continuously changing inmost locations with respect to height. In some examples, the germanium concentration may therefore have a gradient throughout the entire silicon germanium epitaxial layer. In FIG. 5C, the germanium concentration of from the top surface of the recessed region 150 to height x may correspond to the germanium concentration described herein with respect to the buffer epitaxial layer 182, 182a or 182b; the germanium concentration from height x to height y may correspond to the germanium concentration described herein with respect to the first epitaxial layer 184, 184a or 184b; the germanium concentration from height y to height z may correspond to the germanium concentration described herein with respect to the second epitaxial layer 186, 186a or 186b; and the germanium concentration from height z to height h may correspond to the germanium concentration described herein with respect to the third epitaxial layer 188, 188a or 188b. The concentration of Ge in each epitaxial layer may be substantially the same or it may be vary with respect to height.

Figure 6:
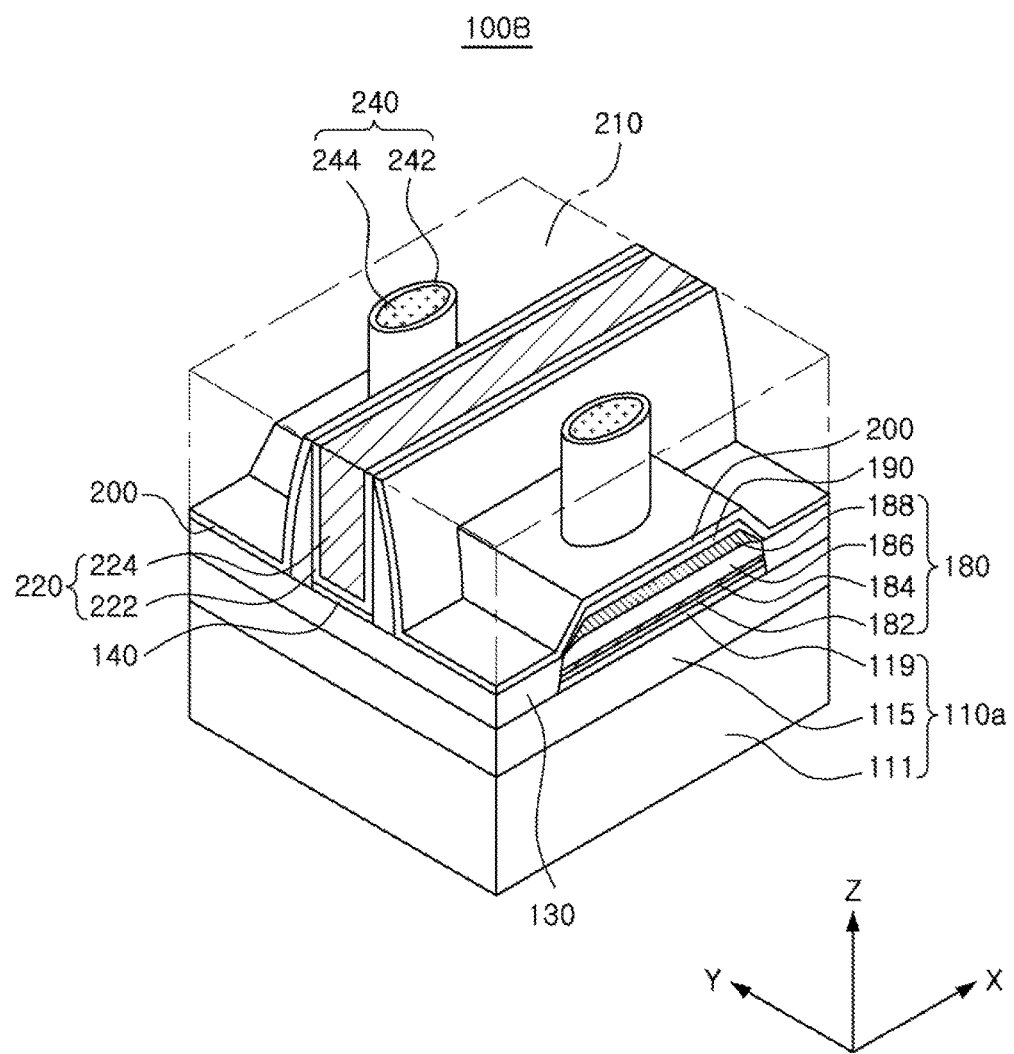
FIG. 6 is a schematic perspective view of a semiconductor device according to an example embodiment of the present disclosure.
Figure 7A:
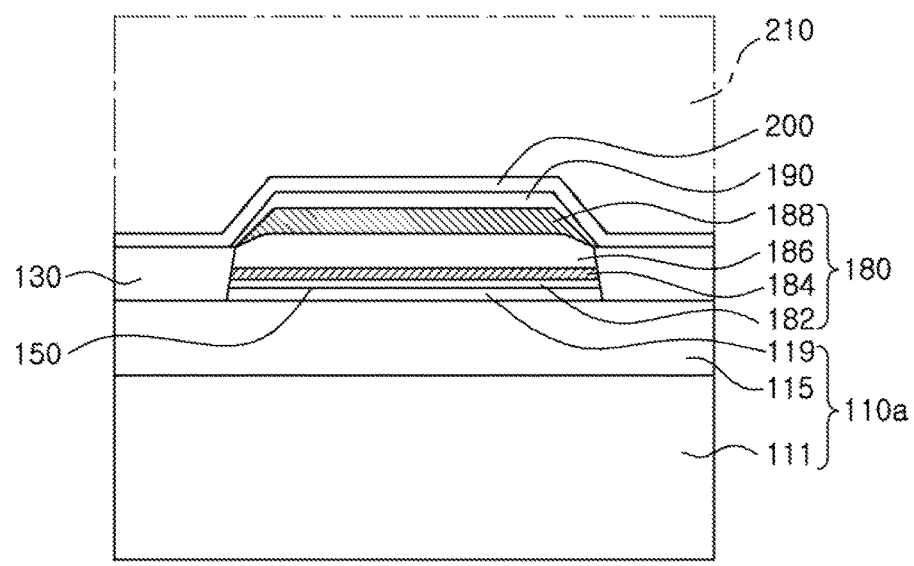
FIGS. 7A through 7D are cross-sectional views of the semiconductor device illustrated in FIG. 6, cut in certain directions.
Figure 7B:
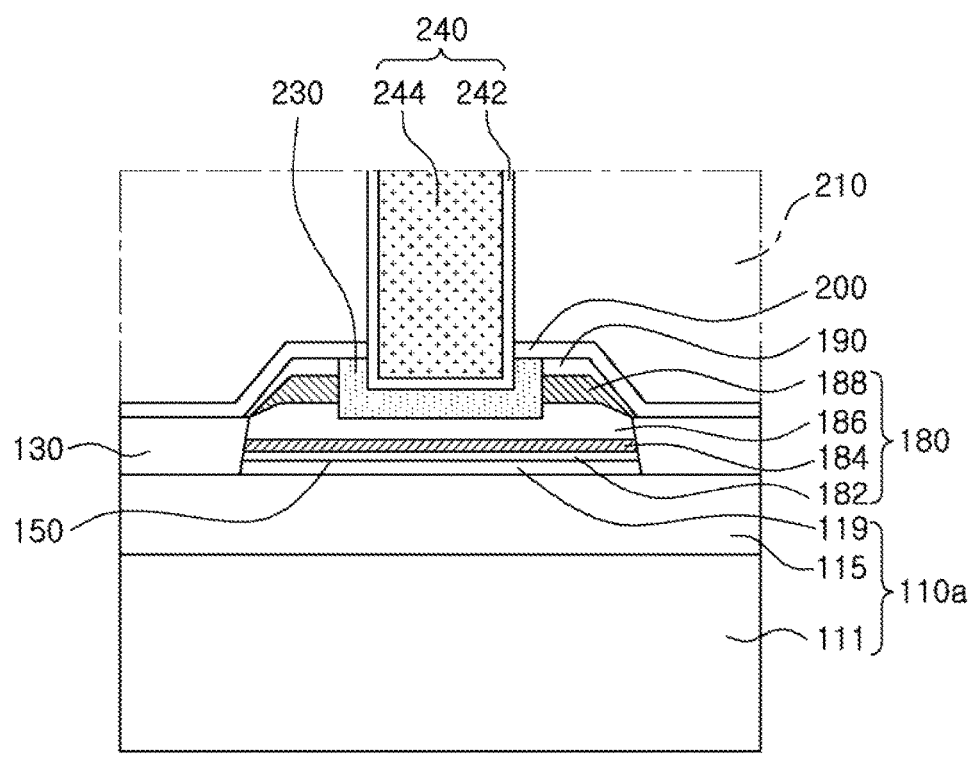
Figure 7C:
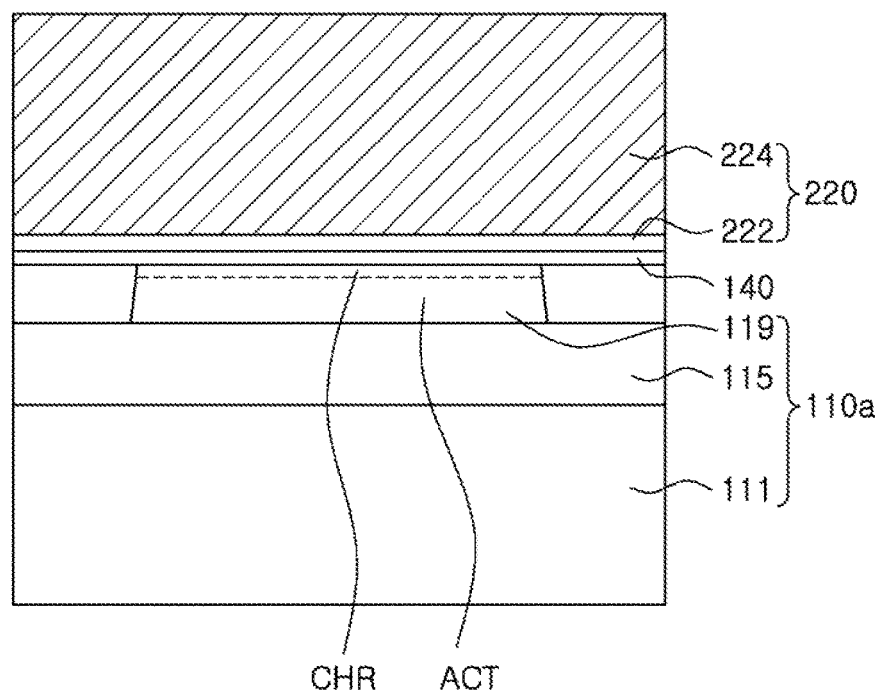
Figure 7D:
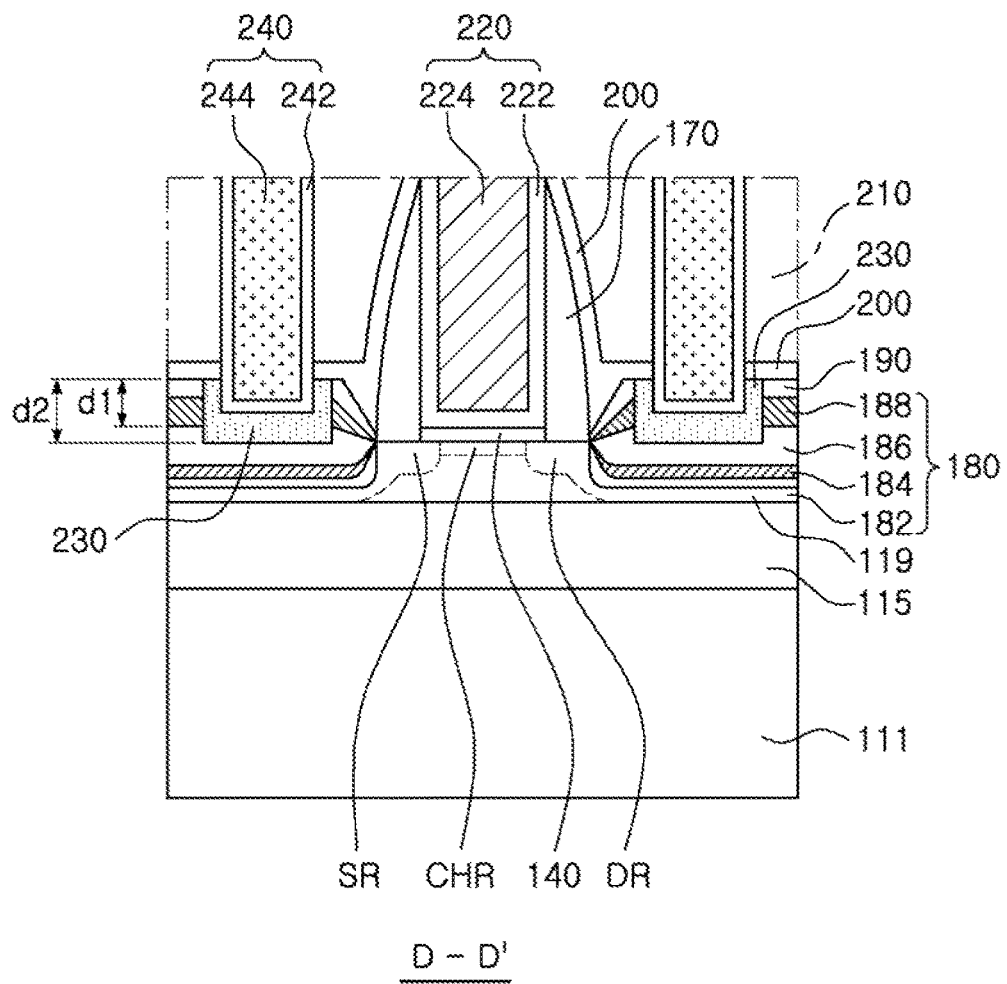

FIG. 6 is a schematic perspective view of a semiconductor device according to another example embodiment of the present disclosure. FIGS. 7A through 7D are cross-sectional views of the semiconductor device according to an example embodiment of the present disclosure, cut in certain directions. In particular, FIGS. 7A through 7D are cross-sectional views of the semiconductor device illustrated in FIG. 6, taken along line A-A', line B-B', line C-C', and line D-D' of FIG. 2, respectively.

In contrast with the semiconductor device 100A, illustrated in FIG. 1, a semiconductor substrate 110a of a semiconductor device 100B according to an example embodiment of the present disclosure, illustrated in FIG. 6, may be a silicon-on-insulator (SOI) substrate. Therefore, descriptions overlapped with those in connection with FIG. 1 and FIGS. 3A through 3D will be omitted.

The SOI substrate may be manufactured by a manufacturing method such as Separation by Implanted Oxygen (SIMOX), Bonded and Etch back SOI (BESOI) or the like. The SOI substrate may include a silicon substrate 111, an insulating layer 115 formed on the silicon substrate 111, and a silicon-on-insulator (SOI) layer 119. Although not illustrated, a silicon germanium layer may be further provided between the insulating layer 115 and the SOI layer 119.

Referring to FIGS. 7A through 7D, in the example embodiment, since the SOI layer 119 forming the active region ACT is thinner than that of the semiconductor device described with reference to FIG. 1 and FIGS. 3A through 3D, thicknesses of the respective epitaxial layers 182, 184, 186 and 188 included in the silicon germanium epitaxial layer 180 may be reduced. In the example embodiment, the silicon germanium epitaxial layer 180a and the silicon germanium epitaxial layer 180b described with reference to FIGS. 4 and 5 may also be used.

In the example embodiment, a portion of the silicon disposed below the gate electrodes 220 may be partially depleted or may be fully depleted.

Figure 8:
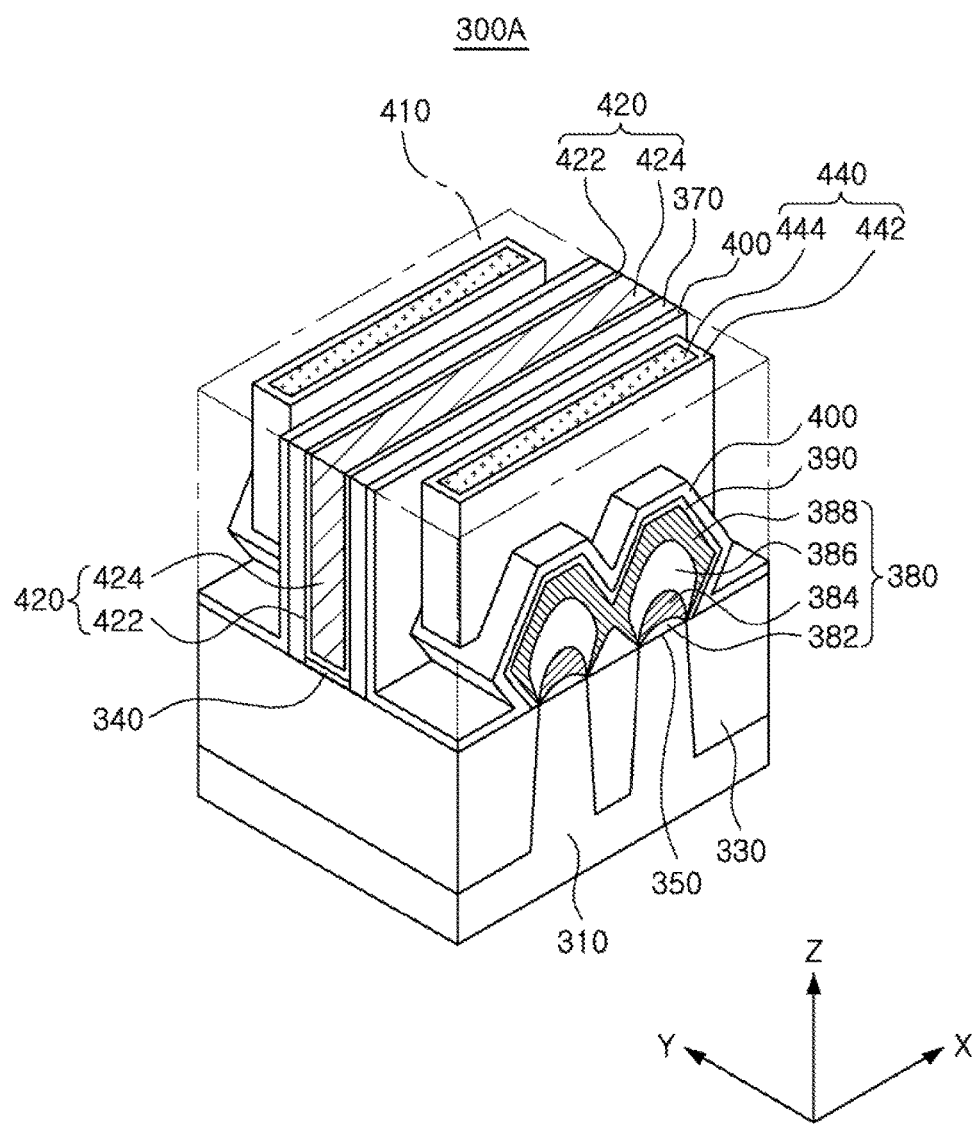
FIG. 8 is a schematic perspective view of a semiconductor device according to an example embodiment of the present disclosure.
Figure 9:
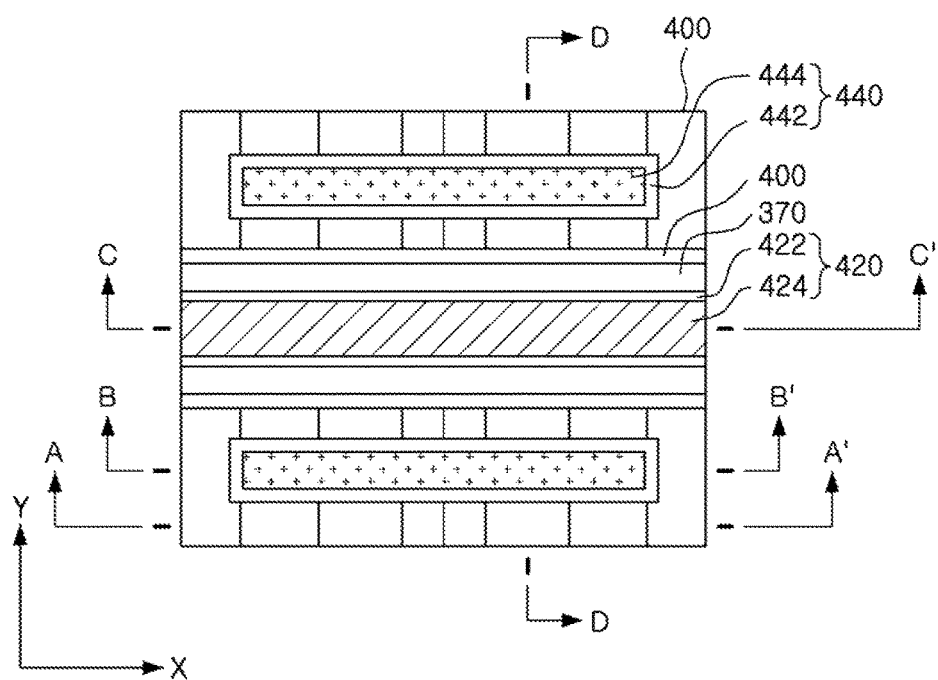
FIG. 9 is a plan view of the semiconductor device illustrated in FIG. 8.

FIG. 8 is a schematic perspective view of a semiconductor device according to an example embodiment of the present disclosure. FIG. 9 is a plan view of the semiconductor device illustrated in FIG. 8. FIGS. 10A through 10D are cross-sectional views of the semiconductor device illustrated in FIG. 8, cut in certain directions. In particular, FIGS. 10A through 10D are cross-sectional views of the semiconductor device illustrated in FIG. 8, taken along line A-A', line B-B', line C-C', and line D-D' of FIG. 9, respectively.

Referring to FIG. 8 and FIGS. 10A through 10D, a semiconductor device 300A according to an example embodiment of the present disclosure may include a semiconductor substrate 310 having active regions ACT defined by device isolating layers 330, gate electrodes 420 disposed to cross the active regions ACT, a gate insulating layer 340 disposed below the gate electrodes 420, spacers 370 disposed on both sidewalls of the gate electrodes 420, source regions SR and drain regions DR disposed in locations within the active regions ACT corresponding to both sides of the gate electrodes 420 and doped with an impurity, and channel regions CHR disposed between the source regions SR and the drain regions DR within the active regions ACT and positioned below the gate insulating layer 340. In addition, the semiconductor device 300A according to an example embodiment of the present disclosure may include silicon germanium epitaxial layers 380 disposed in at least portions of the source regions SR and the drain regions DR and having upper surfaces elevated to a position higher than an upper surface of the active region ACT, a silicon capping layer 390 disposed on the silicon germanium epitaxial layers 380, an etch stopping layer 400 and an interlayer insulating layer 410 disposed on the gate electrodes 420, the device isolating layers 330, and the silicon capping layer 390, and contact plugs 440 connected to the silicon germanium epitaxial layers 380.

In an example embodiment of the present disclosure, the semiconductor substrate 310 may be a monocrystalline silicon substrate doped with an n-type impurity. The device isolating layers 330 may be formed of at least one from among, for example, a Borophosphosilicate glass (BPSG) layer, a High Density Plasma (HDP) layer, a Flowable Oxide (FOX) layer, a Tonen SilaZene (TOSZ) layer, a Spin On Glass (SOG) layer, an Undoped Silica Glass (USG) layer, a Tetraethylorthosilicate (TEOS) layer, and a Low Temperature Oxide (LTO) layer. A width, in an x-direction, of each of the active regions ACT may be reduced while the active regions ACT are extended upwardly. In addition, the active regions ACT may be extended in a single direction, for example, in a y-direction. Although two active regions ACT are illustrated in FIGS. 10A through 10D, the number of active regions ACT is not limited thereto. The device isolating layers 330 may fill a space between the active regions ACT to a predetermined height, and upper portions of the active regions ACT protruding upwardly above the device isolating layers 330 may be considered active fins AF.

The gate insulating layer 340 may include at least one from among, for example, a silicon oxide layer, a silicon oxynitride layer, a silicon nitride layer, and a high-k dielectric layer, and may be configured as a plurality of layers. The high-k dielectric layer may be comprised of an insulating material having a dielectric constant higher than that of the silicon oxide layer and may be at least one from among, for example, a tantalum oxide layer, a titanium oxide layer, a hafnium oxide layer, a zirconium oxide layer, an aluminum oxide layer, a yttrium oxide layer, a niobium oxide layer, hafnium silicate, and zirconium silicate.

The gate electrodes 420 may include a first gate electrode 422 and a second gate electrode 424. The first gate electrode 422 may be formed of a metal nitride. For example, the first gate electrode 422 may be formed of at least one of titanium nitride (TiN), tantalum nitride (TaN), tungsten nitride (WN) and the like. The second gate electrode 424 may be formed of a metal. For example, the second gate electrode 424 may be formed of at least one of aluminum (Al), tungsten (W), molybdenum (Mo) and the like. The first gate electrode 422 may serve as a diffusion barrier layer for the metal forming the second gate electrode 424.

The etch stopping layer 400 may be, for example, a silicon nitride layer or a silicon oxynitride layer, and the interlayer insulating layer 410 may be formed of a silicon oxide layer, Tetraethylorthosilicate (TEOS), Undoped Silicate Glass (USG), Phosphosilicate Glass (PSG), Borosilicate Glass (BSG), Borophosphosilicate Glass (BPSG), Fluoride Silicate Glass (FSG), Spin On Glass (SOG), Tonen Silazene (TOSZ), or combinations thereof.

Figure 10A:
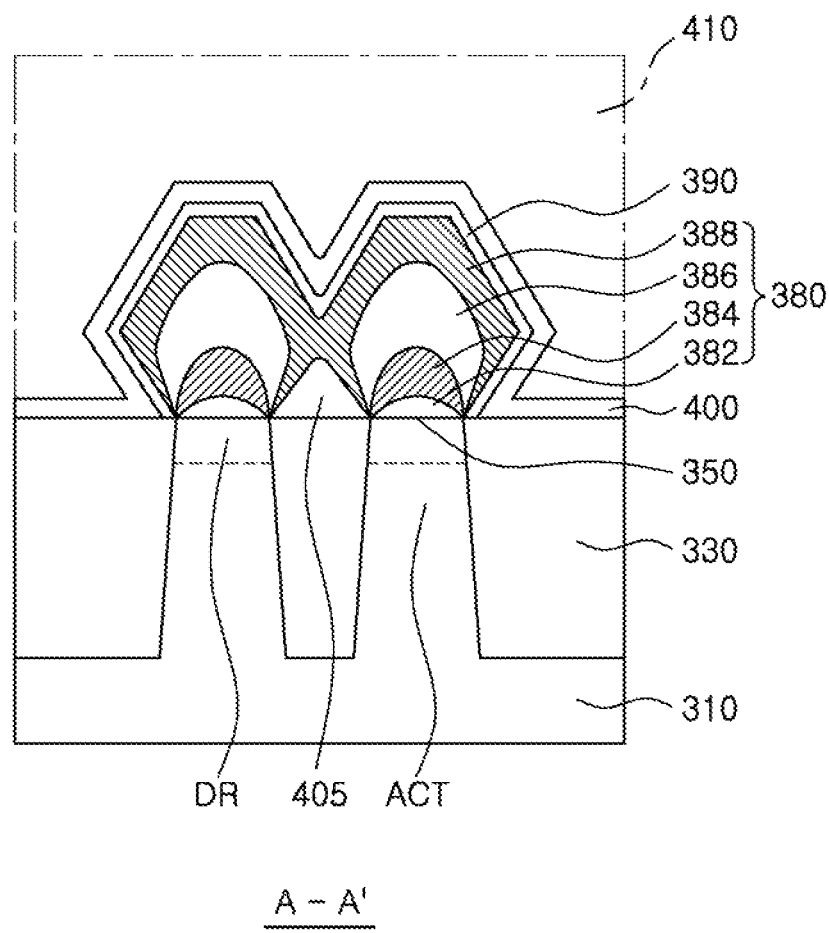
FIGS. 10A through 10D are cross-sectional views of the semiconductor device illustrated in FIG. 8, cut in certain directions.

Referring to FIG. 10A, the silicon germanium epitaxial layers 380 will be described in detail. The silicon germanium epitaxial layers 380 disposed in at least a portion of the drain regions DR within the active regions ACT may include four layers having different germanium concentrations. In accordance with the drawings, a description is made on the basis of the drain regions DR but may also be applied to the source regions SR.

Buffer epitaxial layers 382 may be disposed in a lowermost portion of the silicon germanium epitaxial layers 380 within recessed regions 350 formed by removing at least portions of the drain regions DR. First epitaxial layers 384, second epitaxial layer 386, and third epitaxial layers 388 may be sequentially disposed on the buffer epitaxial layers 382. Bottom surfaces of the recessed regions 350 may be provided in parallel with a surface of the semiconductor substrate 310. Although FIG. 10A illustrates a case in which the bottom surfaces of the recessed regions 350 are positioned at the same height as an upper surface of the device isolating layer 330, the present disclosure is not limited thereto. The silicon germanium epitaxial layers 380 may have upper surfaces parallel to the surface of the semiconductor substrate 310 and side surfaces inclined with respect to the surface of the semiconductor substrate 310. The upper surfaces of the silicon germanium epitaxial layers 380 may be disposed in a position higher than certain upper surfaces of the active regions ACT. Such elevated source and drain structures may reduce resistance in the source and drain regions. At least portions of regions of the silicon germanium epitaxial layers 380 grown from the active fins AF adjacent to each other may be merged. In particular, portions of the third epitaxial layers 388 are connected to each other. However, the present disclosure is not limited thereto. A triangular region 405 between the merged silicon germanium epitaxial layers 380 and the device isolating layer 330 may be an air gap.

The buffer epitaxial layers 382 may have the least germanium (Ge) concentration, while the second epitaxial layers 386 may have the greatest germanium concentration. In detail, the germanium concentration of the buffer epitaxial layers 382 may be in a range of 10 at % to 25 at %, the germanium concentration of the first epitaxial layers 384 may be in a range of 25 at % to 50 at %, the germanium concentration of the second epitaxial layers 386 may be in a range of 50 at % to 90 at %, and the germanium concentration of the third epitaxial layers 388 may be in a range of 25 at % to 50 at %. The relative amounts of germanium may be as described elsewhere herein. The buffer epitaxial layers 382 may reduce a lattice mismatch between the first epitaxial layers 384 and the active regions ACT formed of silicon, thereby decreasing lattice defect in the silicon germanium epitaxial layers 380. Thicknesses of the respective epitaxial layers 382, 384, 386, and 388 may be different and for example, the second epitaxial layers 386 may have a greatest thickness. Thickness ratios of the respective epitaxial layers 382, 384, 386, and 388 are not limited to those illustrated in the example embodiment and may be appropriately adjusted, if necessary. In the example embodiment, the silicon germanium epitaxial layer 180a and the silicon germanium epitaxial layer 180b described with reference to FIGS. 4 and 5 may also be used.

The silicon germanium epitaxial layers 380 may be doped with a p-type impurity at a high concentration and may form at least portions of the source regions and the drain regions. The doping of the p-type impurity at a high concentration may be performed using an in-situ doping method during the growth of the silicon germanium epitaxial layer 380. In contrast, the doping of the p-type impurity at a high concentration may be performed through an ion implantation process, using, as a buffer layer, the silicon capping layer 390 formed on the silicon germanium epitaxial layers 380 after the growth of the silicon germanium epitaxial layers 380 is completed. The concentration of the p-type impurity within the silicon germanium epitaxial layers 380 may be varied in proportion to the germanium (Ge) concentration, and for example, the second epitaxial layers 386 may have the highest concentration of the p-type impurity. In an example embodiment, the p-type impurity may be boron (B).

Figure 10B:
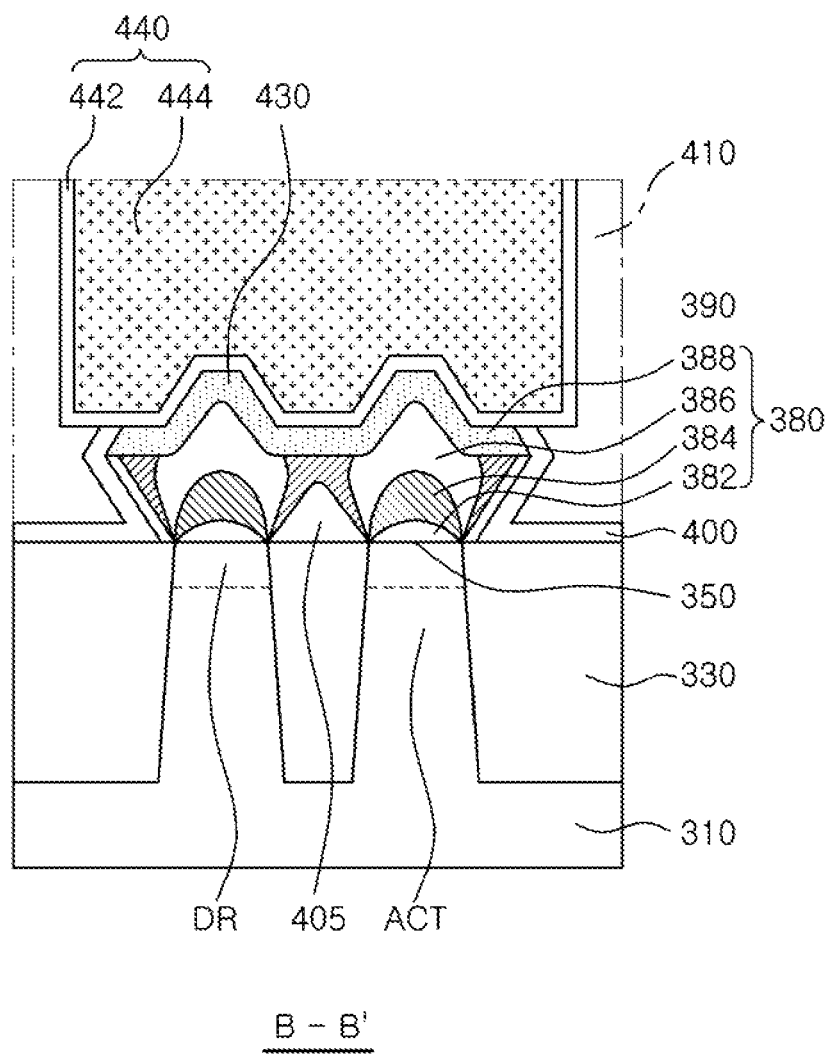
Figure 10C:
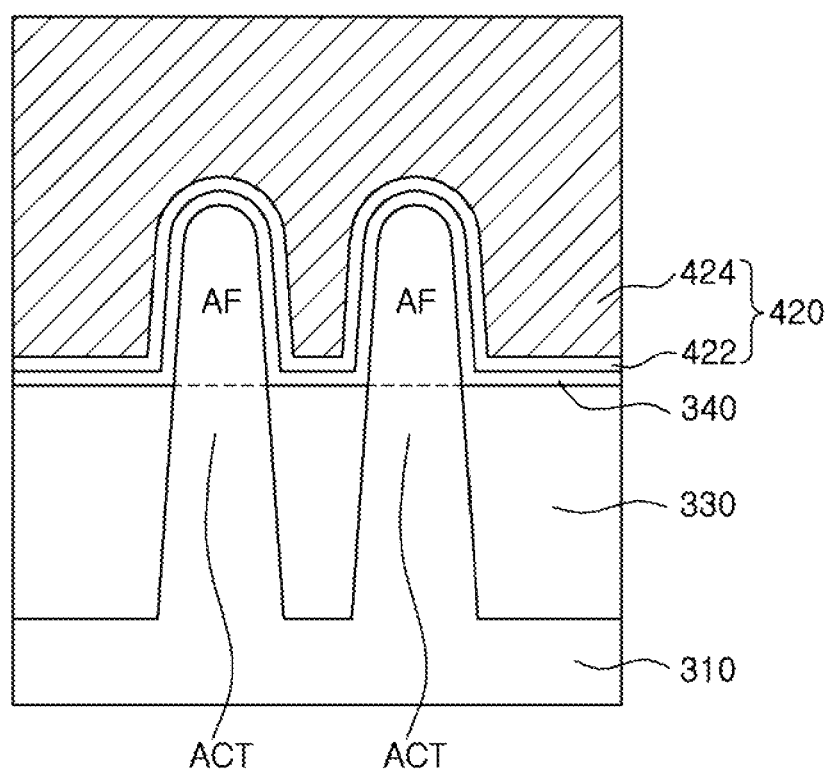
Figure 10D:
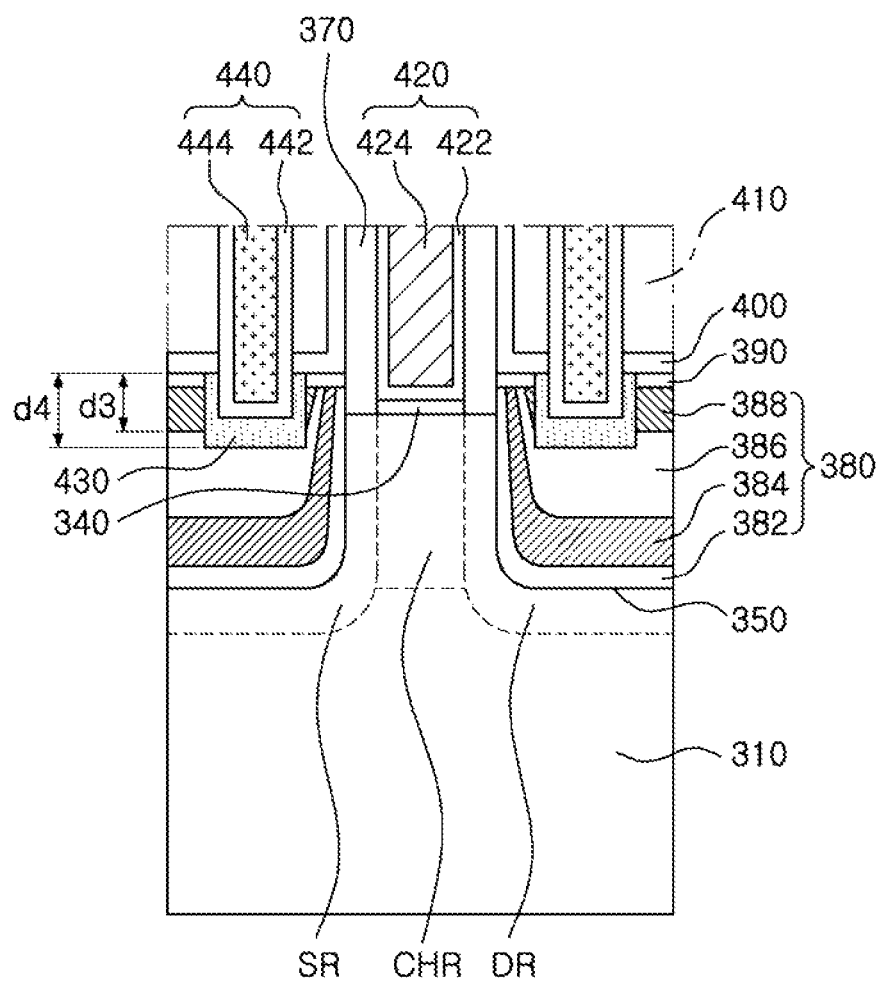

Referring to FIGS. 10B and 10D, the contact plugs 440 connected to the silicon germanium epitaxial layers 380 will be described in detail. The contact plugs 440 may have a rectangular shape in which they are extended in a direction parallel to the gate electrodes 420 so as to be connected to the silicon germanium epitaxial layers 380 having a merged structure on the two active fins AF adjacent to each other. Such a structure may increase a contact area of the contact plugs and consequently, may be advantageous in terms of a reduction of contact resistance. A low-end portion of the contact plugs 440 may have a serrated shape including indentations in its bottom surface each corresponding to an upper end portion of the silicon germanium epitaxial layer 380. However, the present disclosure is not limited thereto, and in accordance with etching conditions, the serrated shape may be formed smooth or be planarized.

The contact plugs 440 may include a first material 442 and a second material 444. The first material 442 may be formed of a metal nitride. For example, the first material 442 may be formed of at least one of titanium nitride (TiN), tantalum nitride (TaN), tungsten nitride (WN) and the like. The second material 444 may be formed of a metal. For example, the second material 444 may be formed of at least one of aluminum (Al), tungsten (W), molybdenum (Mo) and the like. The first material 442 may serve as a diffusion barrier layer for the metal forming the second contact plug 444.

A metal silicide layer 430 may be further disposed between the silicon germanium epitaxial layers 380 and the contact plugs 440. The metal silicide layer 430 may be formed of at least one from among, for example, nickel silicide, cobalt silicide, tungsten silicide, titanium silicide, tantalum silicide, niobium silicide, and the like.

In an example embodiment of the present disclosure, the contact plugs 440 may penetrate through the interlayer insulating layer 410 and be extended into the third epitaxial layers 388, and the metal silicide layer 430 may be formed in an upper region of the second epitaxial layers 386. The distance d4, shown in an example in FIG. 10D, from the upper surface of the silicon capping layer 390 to the lower portion of the metal silicide layer 430 may be greater than the distance d3 from the upper surface of the silicon capping layer 390 to the lower portion of the third epitaxial layers 388. Depending on example embodiments, the contact plugs 440 may be extended into the silicon capping layer 390 and the metal silicide layer 430 may be formed within the third epitaxial layers 388 to come into contact with the second epitaxial layer 386. That is, a distance d4 from an upper surface of the silicon capping layer 390 to a lower portion of the metal silicide layer 430 may be equal to a distance d3 from the upper surface of the silicon capping layer 390 to a lower portion of the third epitaxial layers 388.

As described above, the third epitaxial layers 388 may be disposed on the second epitaxial layers 386, whereby a loss to the second epitaxial layers 386 having the maximum germanium concentration due to a contact etching process and a metal silicide process may be prevented. Therefore, the uniaxial compressive strain may be efficiently caused in the channel regions CHR. In addition, since a Schottky contact may be formed in the second epitaxial layers 386 in which concentrations of the germanium (Ge) and p-type impurity (for example, boron (B)) are greatest, Schottky barrier height and width may be reduced, such that contact resistance may be decreased. Consequently, the performance of the PMOS transistor may be improved.

In actual comparison results to a PMOS transistor including a source/drain having silicon germanium epitaxial layer in which a layer having the lowest germanium composition was used as a buffer layer and in which a layer having the highest germanium composition was disposed as a top layer (with a gradual increase in germanium composition therebetween), the PMOS transistor according to an example embodiment of the present disclosure had a decreased level of contact resistance by about 25%, and an increased current value by about 5%.

FIGS. 11A through 11G are cross-sectional views illustrating respective main processes in a method of manufacturing a semiconductor device and may be used to manufacture the semiconductor device illustrated in FIG. 8, taken along lines B-B', C-C' and D-D' of FIG. 9. In some of FIGS. 11A through 11G, a cross-sectional view taken along line B-B' is identical to a cross-sectional view taken along line C-C' and thus will be omitted.

With reference to FIGS. 11A through 11G, a case in which the semiconductor substrate 310 is a bulk silicon substrate is exemplified. However, the semiconductor substrate 310 is not limited thereto, and even in an embodiment in which the semiconductor substrate 310 is an SOI substrate, the same process may be used as long as no contradiction arises thereby.

Figure 11A:
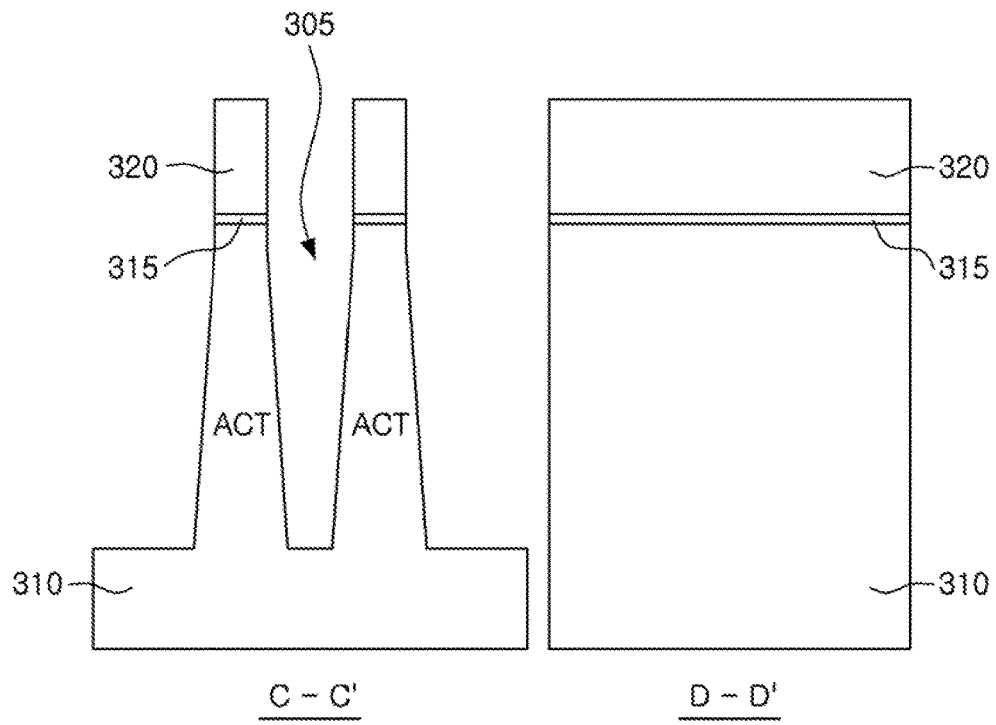
FIGS. 11A through 11G are cross-sectional views illustrating respective main processes in a method of manufacturing the semiconductor device illustrated in FIG. 8.

Referring to FIG. 11A, the semiconductor substrate 310 may be patterned to forma device-isolating trench 305 defining the active regions ACT. The semiconductor substrate 310 may have a well region doped with an impurity and in the example embodiment of the present disclosure, the semiconductor substrate 310 may have a well region doped with an n-type impurity.

The forming of the device-isolating trench 305 may include, after forming mask patterns on the semiconductor substrate 310, anisotropically etching the semiconductor substrate 310 using the mask patterns as an etching mask. The mask patterns may include a first mask pattern 315 and a second mask pattern 320 that have etch selectivity to each other and are sequentially stacked. The device-isolating trench 305 may be formed to have a width reduced in a downward direction and consequently, the active regions ACT may be formed to have a width reduced in an upward direction. In addition, the active regions ACT may be extended in a single direction.

Figure 11B:
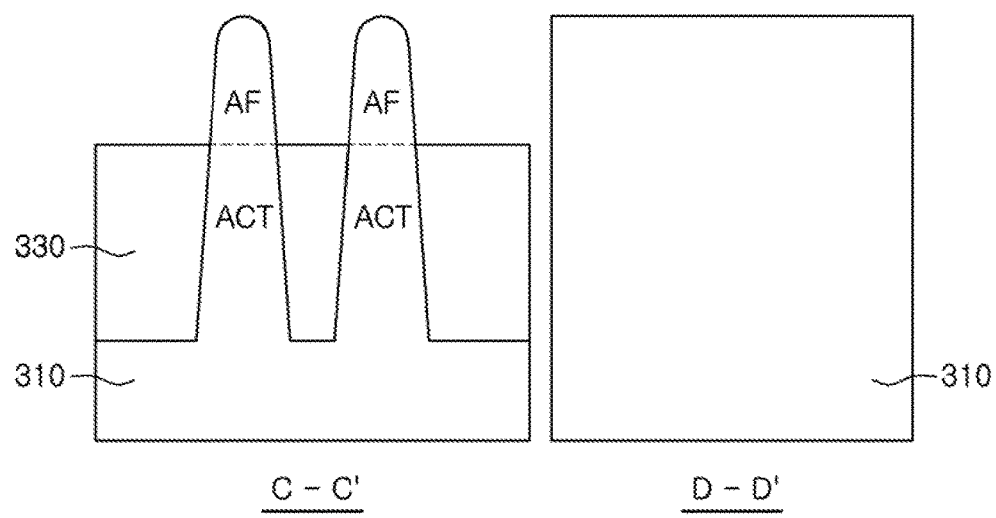

Referring to FIG. 11B, the device isolating layer 330 filling the device-isolating trench 305 to a predetermined height may be formed. The forming of the device-isolating layer 330 may include, after forming an insulating layer filling the device-isolating trench 305, the insulating layer being planarized through a chemical mechanical polishing (CMP) process to thereby expose an upper surface of the second mask pattern 320. The insulating layer filling the device-isolating trench 305 may be at least one from among, for example, a Borophosphosilicate glass (BPSG) layer, a High Density Plasma (HDP) layer, a Flowable Oxide (FOX) layer, a Tonen Silazene (TOSZ) layer, a Spin On Glass (SOG) layer, an Undoped Silica Glass (USG) layer, a Tetraethylorthosilicate (TEOS) layer, and a Low Temperature Oxide (LTO) layer.

Upper portions of the active regions ACT may be exposed. The exposure process of the upper portions of the active regions ACT may include recessing the insulating layer using a dry etching or wet etching scheme. In the process, the first and second mask patterns 315 and 320 may be removed and accordingly, upper surfaces of the active regions ACT may be exposed. In the upper surfaces of the active regions ACT, edges thereof may be etched and accordingly formed to be curved. The upper portions of the active regions ACT protruding above the device-isolating layer 330 may be considered the active fins AF.

Figure 11C:
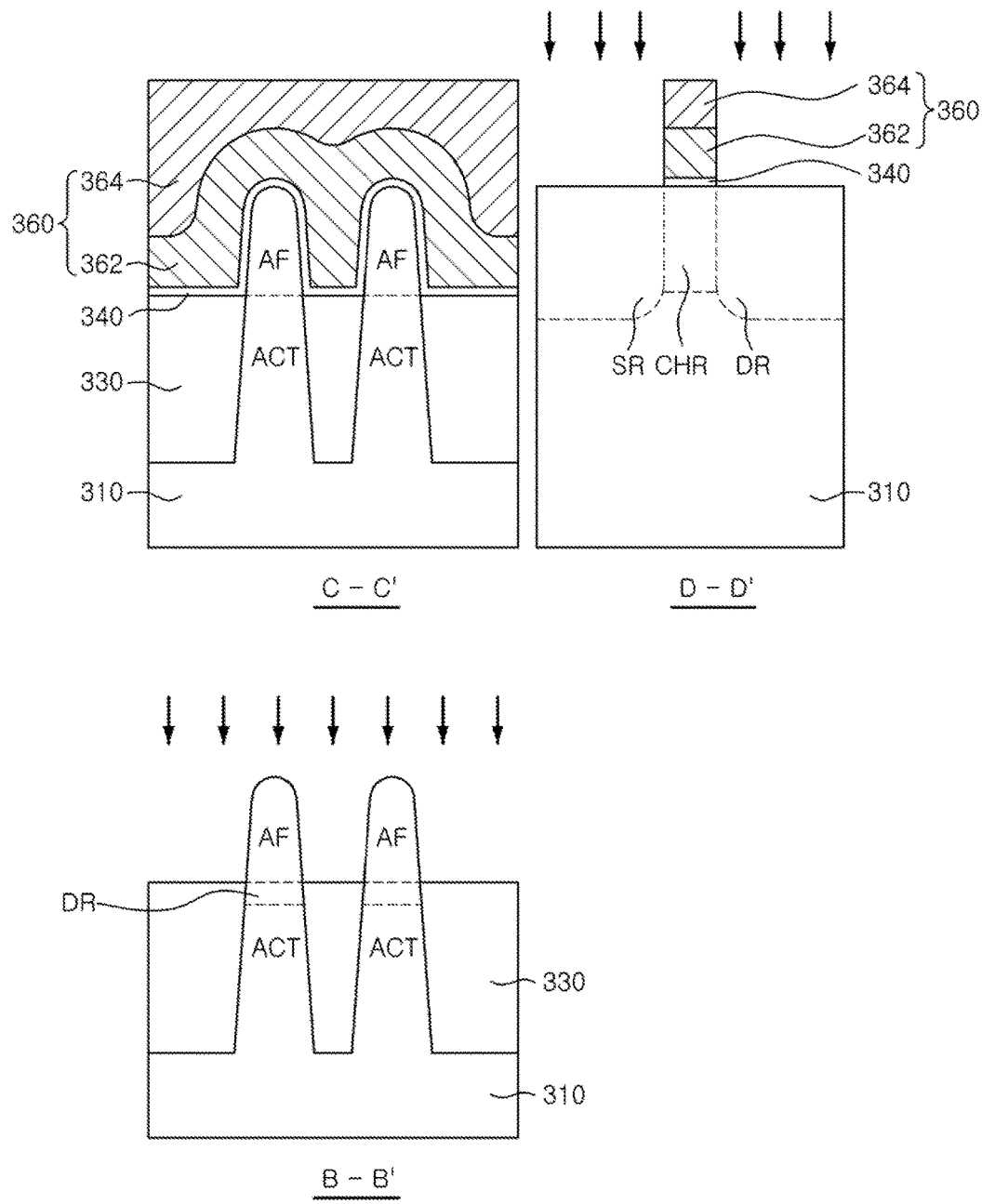

Referring to FIG. 11C, the gate insulating layer 340 covering the active regions ACT and sacrificial gates 360 disposed on the gate insulating layer 340 may be formed. The gate insulating layer 340 may include at least one from among, for example, a silicon oxide layer, a silicon oxynitride layer, a silicon nitride layer, and a high-k dielectric layer, and may be configured as a plurality of layers. The high-k dielectric layer may be comprised of an insulating material having a dielectric constant higher than that of the silicon oxide layer and may be at least one from among, for example, a tantalum oxide layer, a titanium oxide layer, a hafnium oxide layer, a zirconium oxide layer, an aluminum oxide layer, a yttrium oxide layer, a niobium oxide layer, hafnium silicate, and zirconium silicate. The sacrificial gates 360 may include at least one layer having etch selectivity with respect to the gate insulating layer 340. In the example embodiment, the sacrificial gates 360 may include a first sacrificial gate 362 and a second sacrificial gate 364 sequentially stacked on the gate insulating layer 340. The forming of the sacrificial gates 360 may include, after forming sacrificial gate layers by sequentially stacking a first sacrificial layer and a second sacrificial layer on the gate insulating layer 340, anisotropically etching the sacrificial gate layers.

Next, in order to form the source regions SR and the drain regions DR, which are impurity regions in locations within the active regions ACT corresponding to both sides of the sacrificial gates 360, the implantation of p-type impurity ions at a low concentration may be undertaken. If necessary, the implantation of p-type impurity ions may be a tilted ion implantation process performed at a predetermined angle with respect to the both sides of the active regions ACT. In some cases, the implantation of ions in the process may be omitted. The channel regions CHR may be positioned in the active fins AF below the gate electrodes between the source regions SR and the drain regions DR.

Figure 11D:
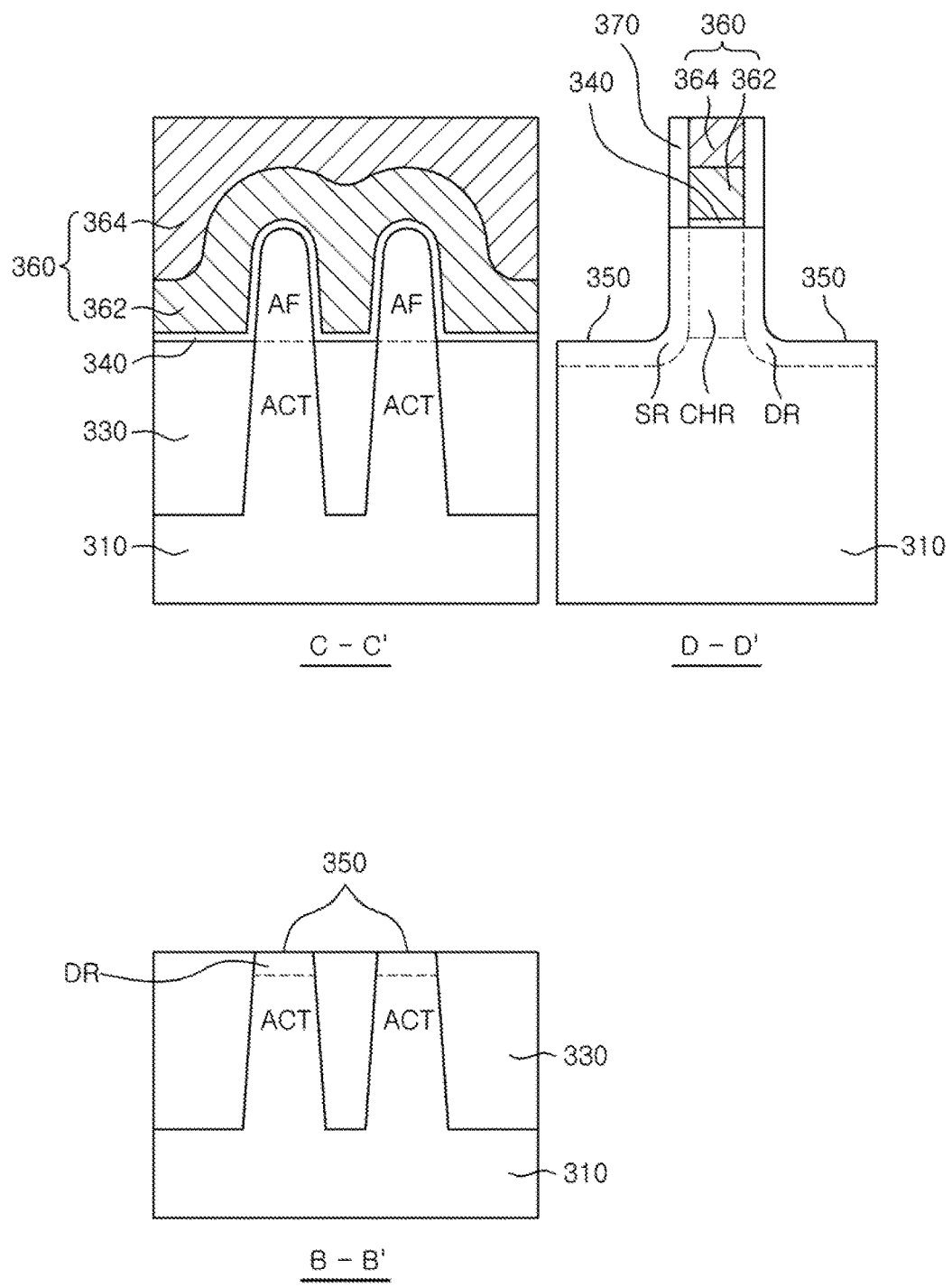

Referring to FIG. 11D, the spacers 370 may be formed on both sidewalls of the sacrificial gates 360. The forming of the spacers 370 may include, after depositing a spacer insulating layer on an overall surface of the semiconductor substrate 310 on which the sacrificial gates 360 are formed, performing an anisotropic etching process such as an etch back process on the spacer insulating layer. During the etching of the spacer insulating layer, upper surfaces and both side surfaces of the source region SR and the drain region DR may be exposed.

Next, the recessed region 350 may be formed by selectively etching at least a portion of each of the source regions SR and the drain regions DR, using the gate electrodes 360 and the spacers 370 as an etching mask. Referring to a cross-sectional view taken along line B-B', a case in which the bottom surface of the recessed region 350 is positioned at the same height as the upper surface of the device isolating layer 330 is illustrated, but the present disclosure is not limited thereto. If necessary, the bottom surface of the recessed region 350 may be positioned at a height greater or lower than the upper surface of the device isolating layer 330. In an embodiment in which the bottom surface of the recessed region 350 is in a position lower than the upper surface of the device isolating layer 330, the side surfaces of the device isolating layer 330 may be exposed.

Figure 11E:
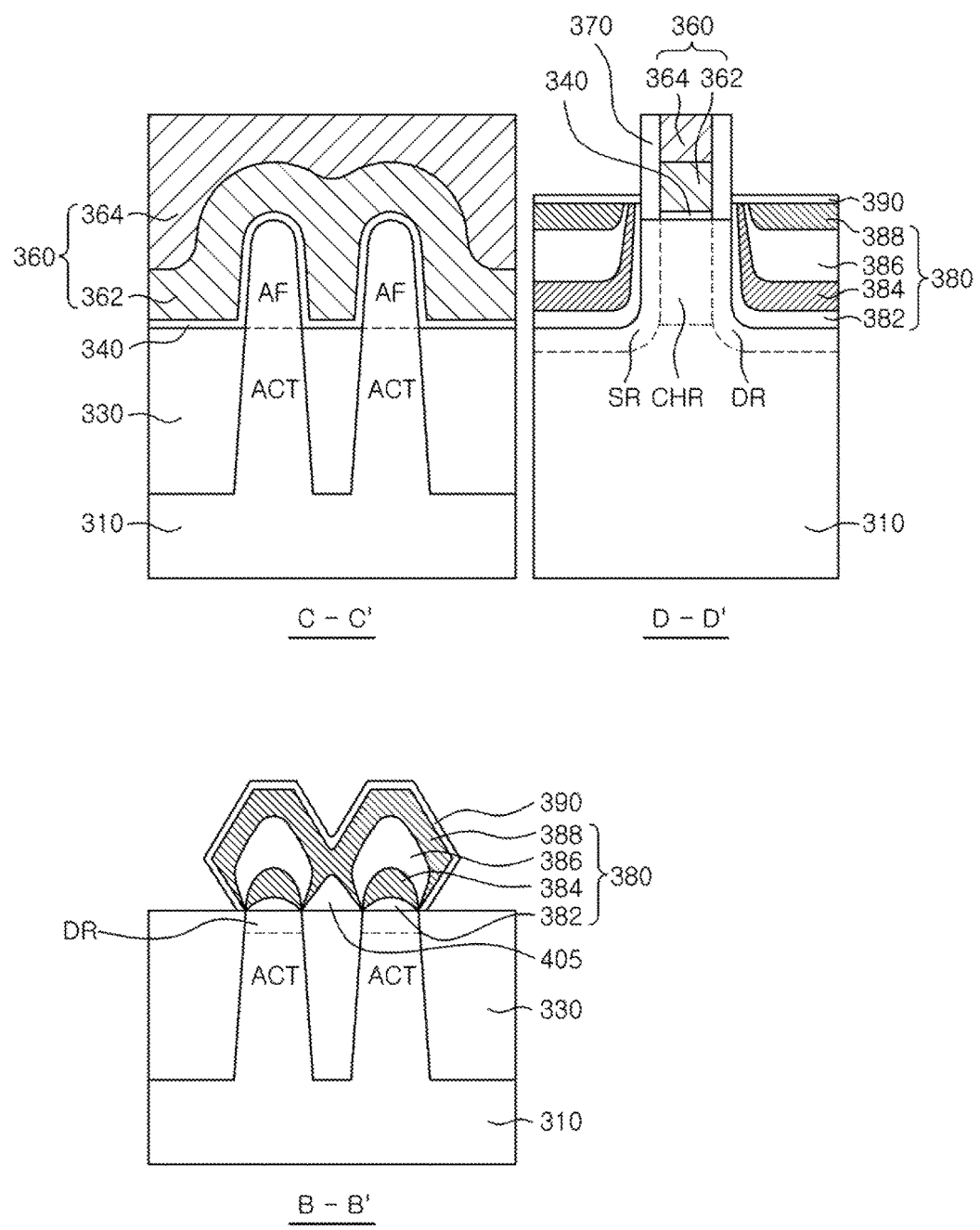

Referring to FIG. 11E, the silicon germanium epitaxial layers 380 may be formed within the recessed region 350 in each of the source regions SR and the drain regions DR by a selective epitaxial growth (SEG) process.

The selective epitaxial growth (SEG) process for forming the silicon germanium epitaxial layers 380 may be a chemical vapor deposition (CVD) process, a reduced pressure chemical vapor deposition (RPCVD) process or an ultra-high vacuum chemical vapor deposition (UHVCVD) process.

In such a selective epitaxial growth (SEG) process, a silicon source gas may be monochlorosilane ($SiH_3Cl$), dichlorosilane ($SiH_2Cl_2$), trichlorosilane ($SiHCl_3$), silane ($SiH_4$), disilane ($Si_2H_6$), or combinations thereof. A germanium source gas may be germane ($GeH_4$), digermane ($Ge_2H_6$), monochloro germane ($GeH_3Cl$), dichlorogermane ($GeH_2Cl_2$), trichlorogermane ($GeHCl_3$) or combinations thereof. In order to enable such source gases to be smoothly supplied to a growth surface, carrier gases may be supplied simultaneously with the source gases. The carrier gas may be at least one of hydrogen ($H_2$), helium (He), nitrogen ($N_2$) and argon (Ar) gases. Flow rate ratios of the respective source gases may be adjusted depending on a concentration ratio of silicon and germanium in the silicon germanium epitaxial layer.

In the example embodiment of the present disclosure, each of the silicon germanium epitaxial layers 380 may include four layers having different germanium concentrations. The silicon germanium epitaxial layer 380 may include the first epitaxial layer 384 having a relatively low germanium concentration, the second epitaxial layer 386 having a relatively high germanium concentration, and the third epitaxial layer 188 having a relatively low germanium concentration. The silicon germanium epitaxial layer 380 may further include the buffer epitaxial layer 382 below the first epitaxial layer 384. The buffer epitaxial layer 382 may reduce a lattice mismatch between the first epitaxial layer 384 and the active region ACT formed of silicon, thereby decreasing a lattice defect in the silicon germanium epitaxial layer 380. The germanium (Ge) concentration of the buffer epitaxial layer 382 may be in a range of 10 at % to 25 at %, the germanium concentration of the first epitaxial layer 384 may be in a range of 25 at % to 50 at %, the germanium concentration of the second epitaxial layer 386 may be in a range of 50 at % to 90 at %, and the germanium concentration of the third epitaxial layer 388 may be in a range of 25 at % to 50 at %. The relative amount of germanium in epitaxial layers 382, 384, 386 and 388 may be as described with respect to other embodiments. In certain embodiments in which the buffer epitaxial layers 382 are not present, the first epitaxial layers 384 may serve as a buffer epitaxial layer. In this embodiment, the germanium concentration of the first epitaxial layers 384 may have a concentration gradient in which the germanium concentration increases in an upward direction of the first epitaxial layers 384, and may be within a range of 10 at % to 50 at %. Thicknesses of the respective epitaxial layers may be different and for example, the second epitaxial layers 386, which causes the highest uniaxial compressive strain in the channel regions CHR, may have the greatest thickness.

The silicon germanium epitaxial layers 380 may be elevated upwardly from an upper surface of the active fin AF. For example, an upper surface of the silicon germanium epitaxial layer 380 may be disposed in a position higher than that of the gate insulating layer 340. Referring to a cross-sectional view taken along line B-B', the silicon germanium epitaxial layer 380 may have certain inclined surfaces, and at least portions of regions of the silicon germanium epitaxial layers 380 grown from the active fins AF adjacent to each other may be merged. In particular, portions of the third epitaxial layers 388 may be connected to each other in a growth process of the third epitaxial layers 388. The triangular region 405 between the merged silicon germanium epitaxial layers 380 and the device isolating layer 330 may be an air gap. The buffer, first, second, and third epitaxial layers may be formed to have a curved, concave shape During the growth of the silicon germanium epitaxial layer 380, the silicon germanium epitaxial layer 380 may be in-situ doped with a p-type impurity, for example, boron (B). In contrast, the p-type impurity may be implanted through an ion implantation process, after the growth of the silicon germanium epitaxial layer 380 is completed.

The p-type impurity may be doped at a high concentration, and the concentration of the p-type impurity may be varied in proportion to the germanium (Ge) concentration within the silicon germanium epitaxial layers 380. That is, the second epitaxial layers 386 having the greatest germanium (Ge) concentration may have the highest concentration of the p-type impurity. The p-type impurity at a high concentration within the silicon germanium epitaxial layers 380 may be diffused into the active regions ACT, whereby source regions and drain regions containing a p-type impurity at a high concentration may be formed.

Next, the silicon capping layer 390 covering surfaces of the silicon germanium epitaxial layers 380 using a selective epitaxial growth (SEG) process may be formed.

Figure 11F:
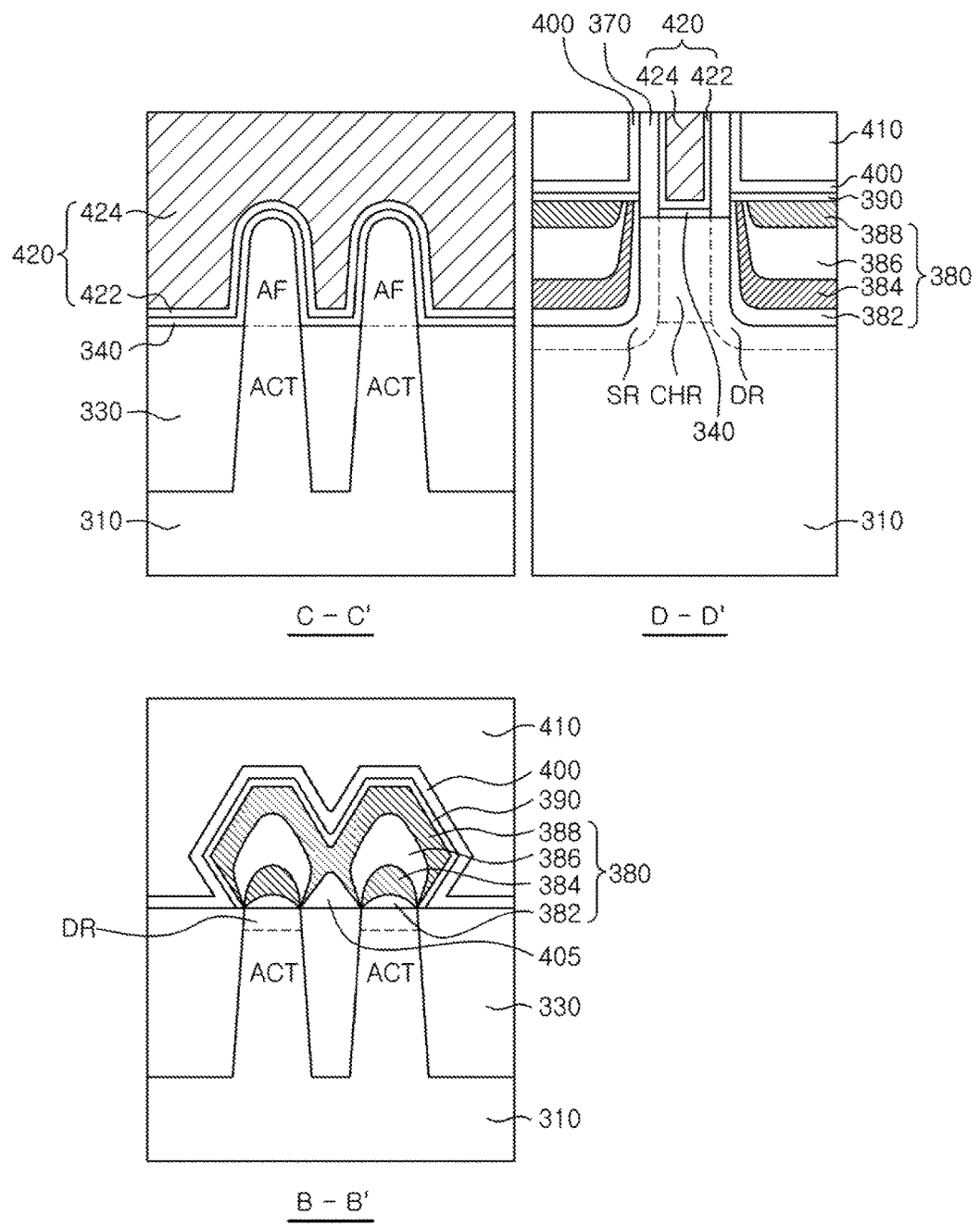

Referring to FIG. 11F, after the silicon germanium epitaxial layers 380 and the silicon capping layer 390 are formed, the etch stopping layer 400 and the interlayer insulating layer 410 covering the overall surface of the semiconductor substrate 310 including the silicon germanium epitaxial layers 380, the silicon capping layer 390, and the sacrificial gates 360 may be sequentially formed. The etch stopping layer 400 may be, for example, a silicon nitride layer or a silicon oxynitride layer and may be formed using a chemical vapor deposition (CVD). The interlayer insulating layer 410 may be formed of a silicon oxide layer, Tetraethylorthosilicate (TEOS), Undoped Silicate Glass (USG), Phosphosilicate Glass (PSG), Borosilicate Glass (BSG), Borophosphosilicate Glass (BPSG), Fluoride Silicate Glass (FSG), Spin On Glass (SOG), Tonen Silazene (TOSZ), or combinations thereof. The interlayer insulating layer 410 may be formed using a chemical vapor deposition (CVD) process, a spin coating method or the like. After forming the interlayer insulating layer 410, a planarization process may be performed. The planarization process may be performed to expose the upper surface of the sacrificial gates 360.

Next, the sacrificial gates 360 exposed between portions of the interlayer insulating layer 410 may be selectively removed to form an opening region through which the gate insulating layer 340 is exposed. The sacrificial gates 360 may be removed using an etchant having etching selectivity with respect to the gate insulating layer 340 and the spacers 370. The gate electrode 420 may be formed by filling the opening. The forming of the gate electrode 420 may include planarizing a conductive layer so as to expose the interlayer insulating layer 410 after the covering of an upper surface of the interlayer insulating layer 410 and the interior of the opening region with the conductive layer, using a deposition method having superior step coverage characteristics. The gate electrode 420 may cover an exposed portion of the gate insulating layer 340 and include the first gate electrode 422 and the second gate electrode 424.

The first gate electrode 422 may be formed of a metal nitride. For example, the first gate electrode 422 may be formed of at least one of titanium nitride (TiN), tantalum nitride (TaN), tungsten nitride (WN) and the like. The second gate electrode 424 may be formed of a metal. For example, the second gate electrode 424 may be formed of at least one of aluminum (Al), tungsten (W), molybdenum (Mo) and the like. The first gate electrode 422 may serve as a diffusion barrier layer for the metal forming the second gate electrode 424.

Figure 11G:
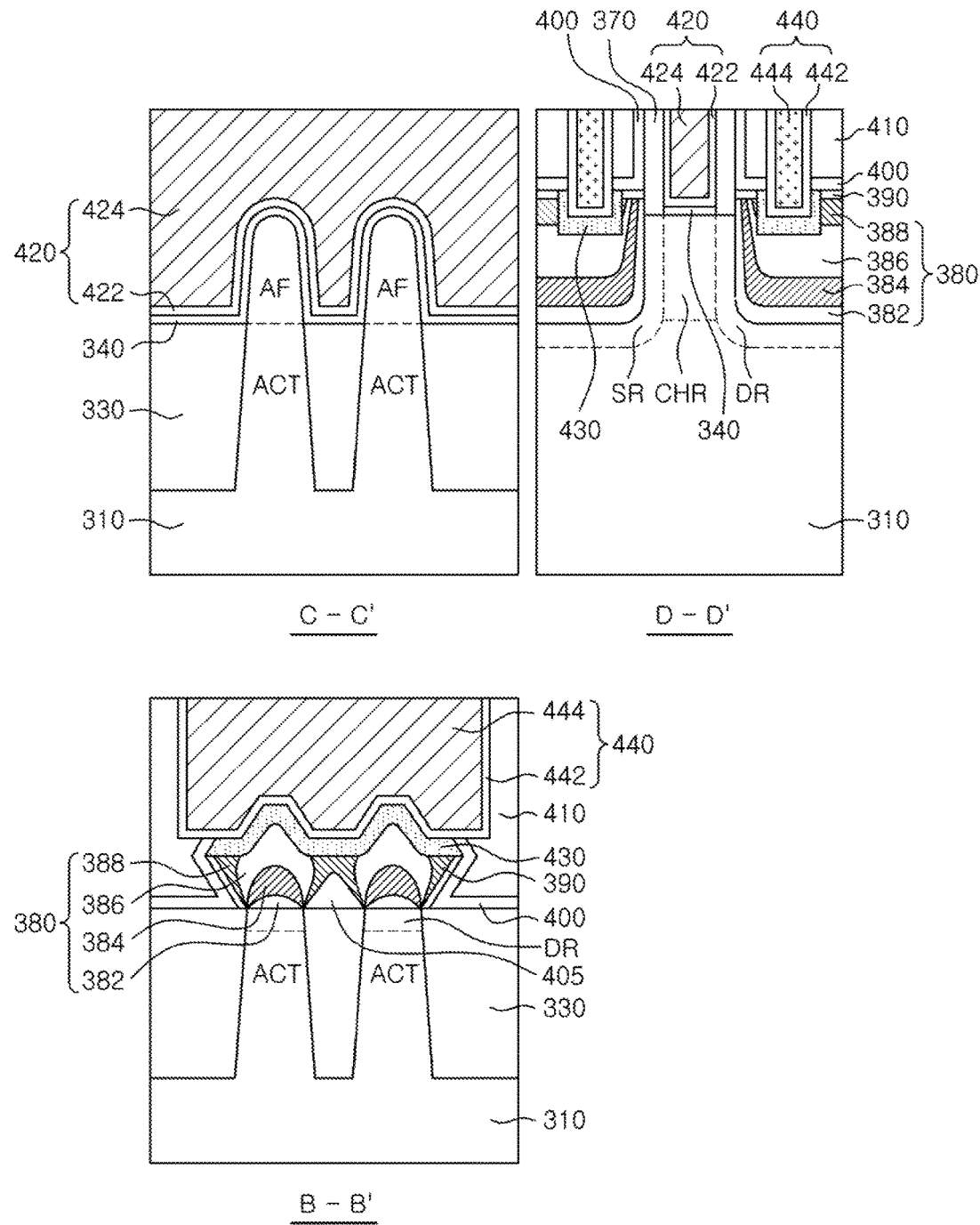

Referring to FIG. 11G, the contact plugs 440 connected to the silicon germanium epitaxial layers 380 may be formed. That is, after forming a contact hole through which the silicon germanium epitaxial layers 380 are exposed by patterning the interlayer insulating layer 410, the contact plugs 440 filling the contact hole may be formed. The metal silicide layer 430 may be formed between the silicon germanium epitaxial layer 380 and the contact plugs 440. In detail, a metal film is covered on the interlayer insulating layer 410 provided with the contact hole and a heat treatment process may be performed on the metal film to thereby form the metal silicide layer 430. Only portions of the silicon capping layer 390 and the silicon germanium epitaxial layer 380 exposed to the interior of the contact hole may react with the metal film, to form metal silicide. The metal silicide layer 430 may be formed of at least one from, for example, a nickel silicide, cobalt silicide, tungsten silicide, titanium silicide, tantalum silicide, niobium silicide, and the like. In an embodiment in which the metal film reacts with the silicon germanium epitaxial layers 380, the metal silicide layer 430 may contain germanium. The remainder of the metal film that does not react with the silicon germanium epitaxial layers 380 may be removed from the interlayer insulating layer 410, and the first contact plug 442 and the second contact plug 444 may fill the inside of the contact hole, thereby forming the contact plugs 440, which come into contact with the metal silicide layer 430. The first contact plug 442 may be formed of a metal nitride. For example, the first contact plug 442 may be formed of at least one of titanium nitride (TiN), tantalum nitride (TaN), tungsten nitride (WN) and the like. The second contact plug 444 may be formed of a metal. For example, the second contact plug 444 may be formed of at least one of aluminum (Al), tungsten (W), molybdenum (Mo) and the like. The first contact plug 442 may serve as a diffusion barrier layer for the metal forming the second contact plug 444.

The contact plugs 440 may penetrate through the interlayer insulating layer 410 and extend into the third epitaxial layers 388, and the metal silicide layer 430 may be formed between the contact plugs 440 and the second epitaxial layers 386. Depending on example embodiments, the contact plugs 440 may be extended into the silicon capping layer 390 and the metal silicide layer 430 may be formed within the third epitaxial layers 388 to come into contact with the second epitaxial layers 386.

Figure 12:
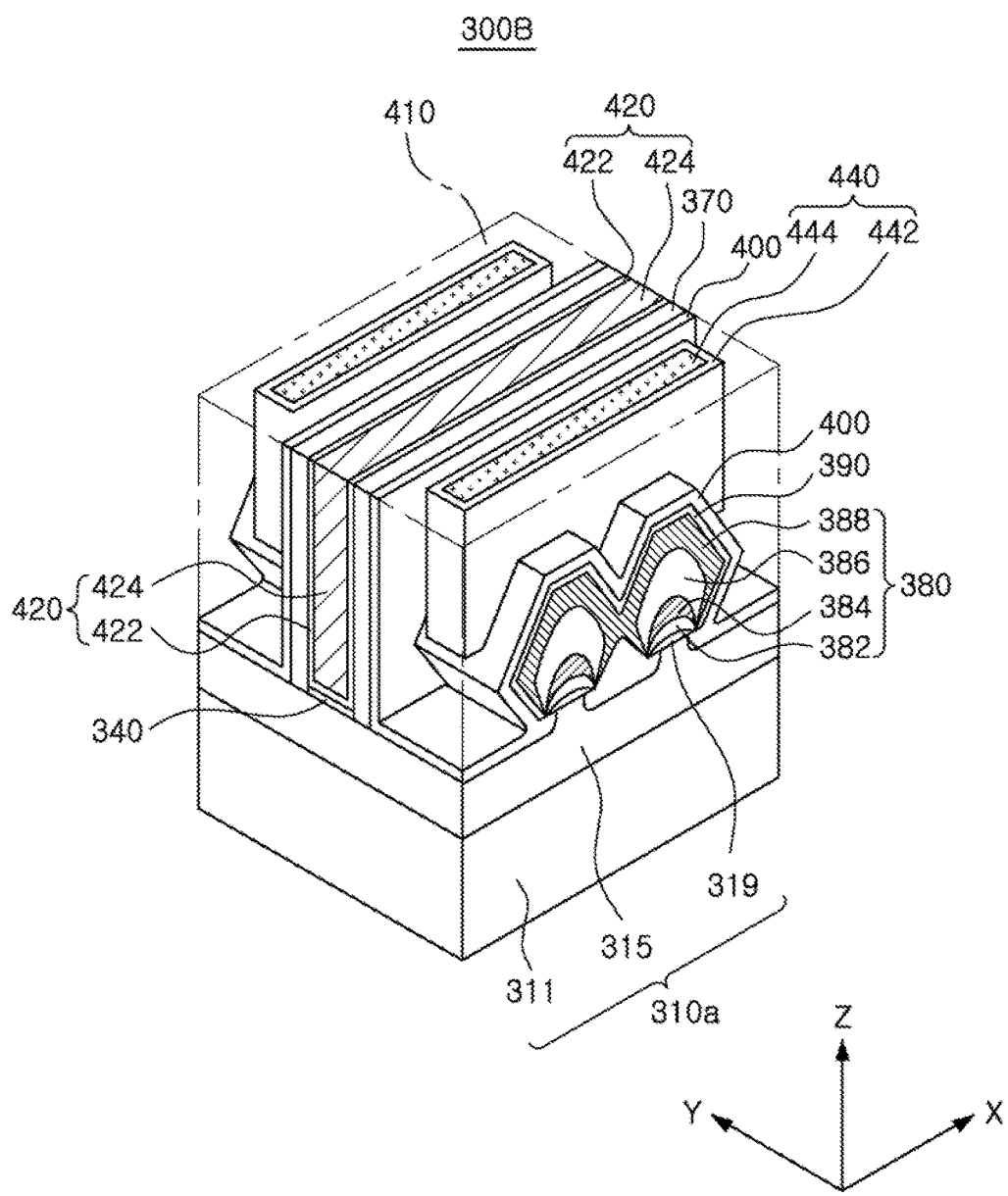
FIG. 12 is a schematic perspective view of a semiconductor device according to an example embodiment of the present disclosure.
Figure 13A:
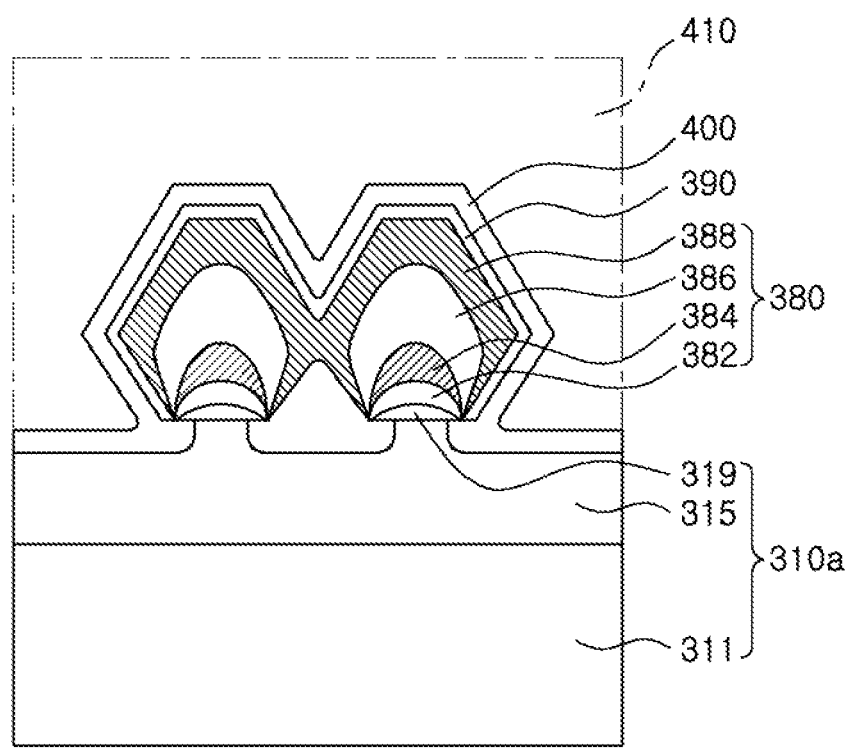
FIGS. 13A through 13D are cross-sectional views of the semiconductor device illustrated in FIG. 12, cut in certain directions.
Figure 13B:
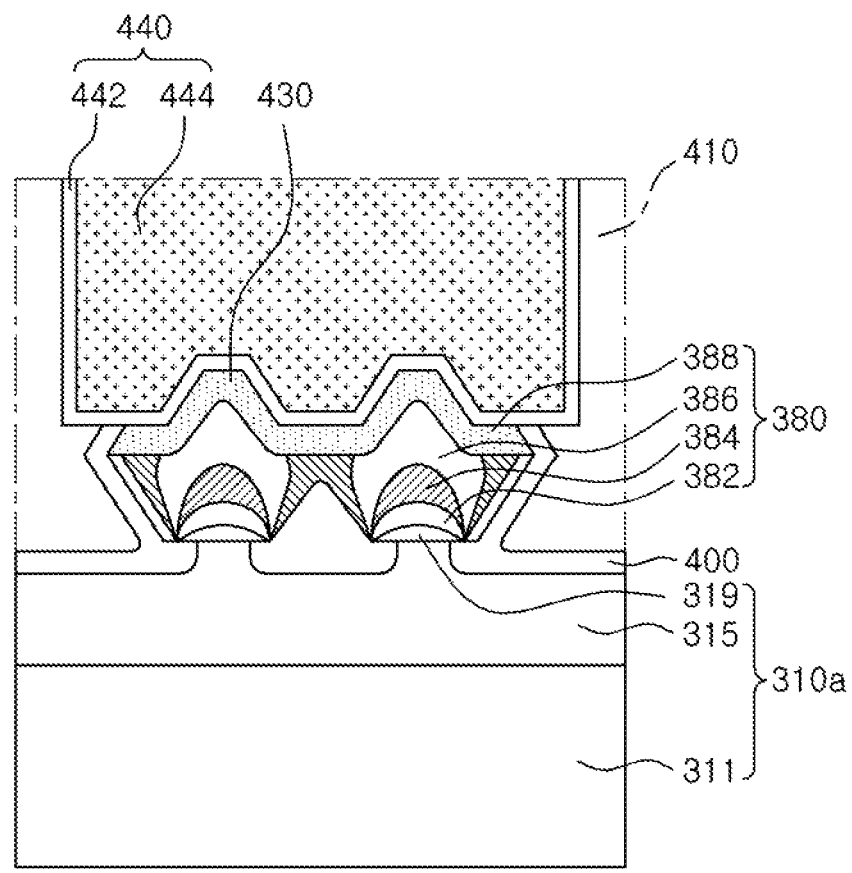
Figure 13C:
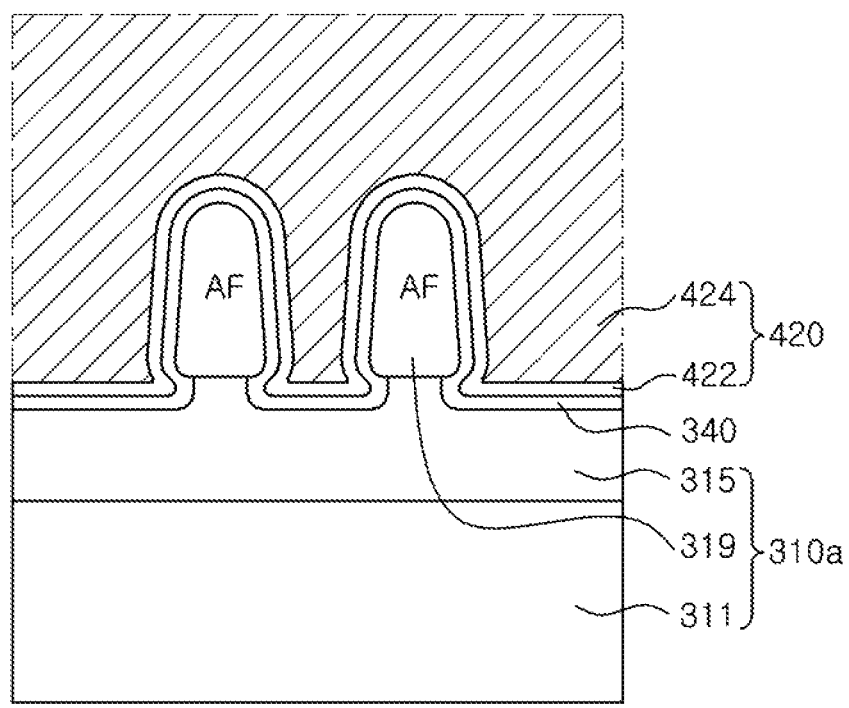
Figure 13D:
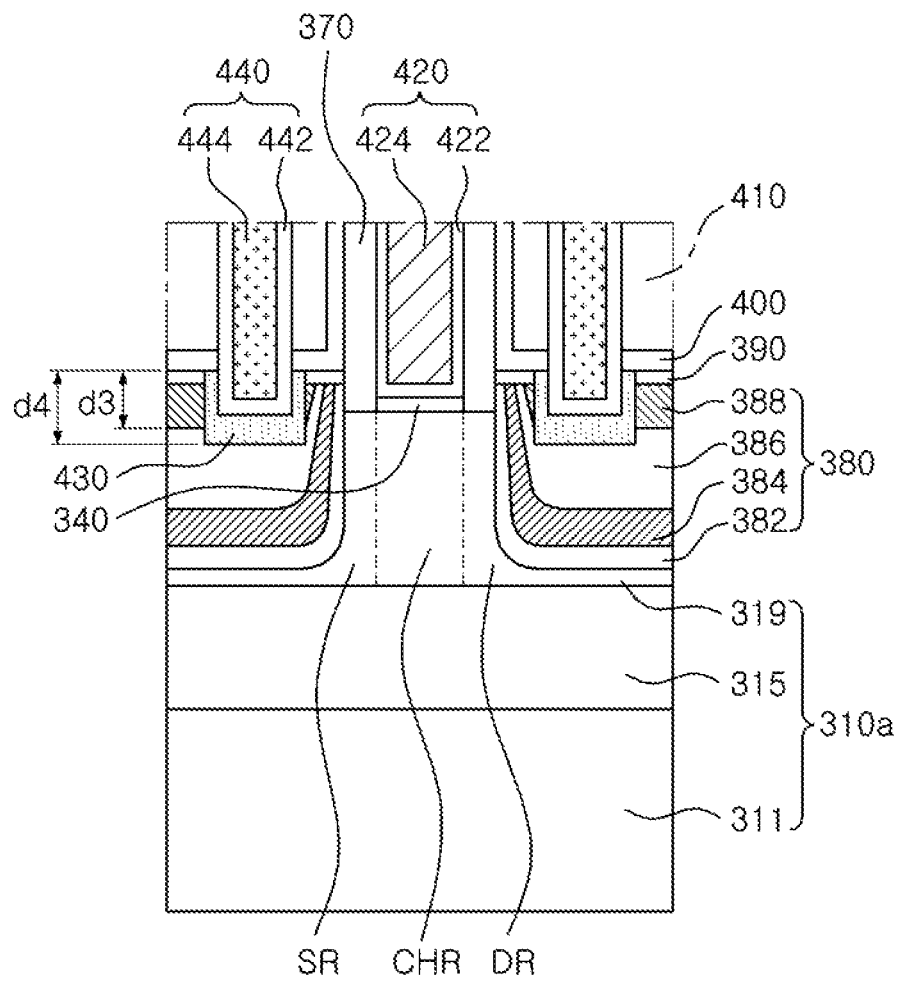

FIG. 12 is a schematic perspective view of a semiconductor device according to another example embodiment of the present disclosure. FIGS. 13A through 13D are cross-sectional views of the semiconductor device illustrated in FIG. 12, cut in certain directions. In particular, FIG. 13A through 13D are cross-sectional views of the semiconductor device illustrated in FIG. 12, taken along line A-A', line B-B', line C-C', and line D-D' of FIG. 9, respectively.

In contrast with the semiconductor device 300A illustrated in FIG. 8, a semiconductor substrate 310a of a semiconductor device 300B, according to another example embodiment of the present disclosure, illustrated in FIG. 12, may be a silicon-on-insulator (SOI) substrate. Since other structures of the semiconductor device 300B with the exception that the semiconductor substrate 310a is a SOI substrate are similar to those of the foregoing embodiments, descriptions thereof overlapped with those of the foregoing embodiments will be omitted. Therefore, descriptions overlapped with those in connection with FIG. 8 and FIGS. 10A through 10D will be omitted.

The SOI substrate may be manufactured by a manufacturing method such as Separation by Implanted Oxygen (SIMOX), Bonded and Etch back SOI (BESOI) or the like. The SOI substrate may include a silicon substrate 311, an insulating layer 315 on the silicon substrate 311, and a silicon-on-insulator (SOI) layer 319. Although not illustrated, a silicon germanium layer may be further provided between the insulating layer 315 and the SOI layer 319.

Referring to FIGS. 13A through 13D, in the example embodiment, the active fins AF may be formed on the insulating layer 315. When the source regions SR and the drain regions DR are recessed, a residual portion of the SOI layer 319 may remain for the growth of the silicon germanium epitaxial layer 380.

In the example embodiment, the silicon germanium epitaxial layer 180a and the silicon germanium epitaxial layer 180b described with reference to FIGS. 4 and 5 may also be used.

Figure 14:
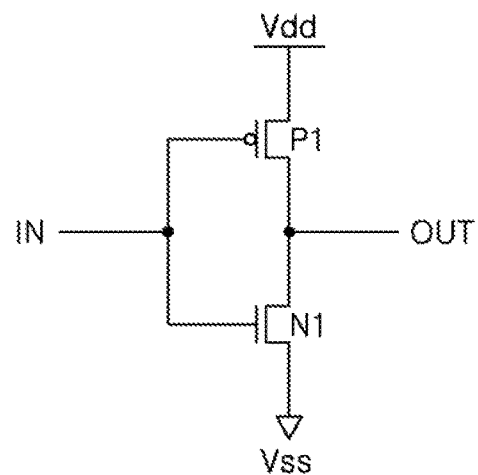
FIG. 14 is a circuit diagram of an inverter, including the semiconductor device, according to an example embodiment of the present disclosure.

FIG. 14 is a circuit diagram of a CMOS inverter according to an example embodiment of the present disclosure.

Referring to FIG. 14, the CMOS inverter may be configured of a PMOS transistor P1 and an NMOS transistor N1. The PMOS transistor P1 may be one of the semiconductor devices 100A, 100B, 300A, and 300B according to the foregoing example embodiments of the present disclosure. The PMOS and NMOS transistors may be connected in series between a power supply voltage line Vdd and a ground voltage line Vss. A common input signal may be input to gates of the PMOS and NMOS transistors. In addition, a common output signal may be output from drains of the PMOS and NMOS transistors. In addition, a driving voltage may be applied to a source of the PMOS transistor and a ground voltage may be applied to a source of the NMOS transistor. Such a CMOS inverter may output an output signal OUT by inverting an input signal IN. In other words, when a logic level of '1' is input as an input signal of the inverter, a logic level of '0' may be output as an output signal of the inverter. When the logic level of '0' is input as the input signal of the inverter, the logic level of '1' may be output as the output signal of the inverter.

Figure 15:
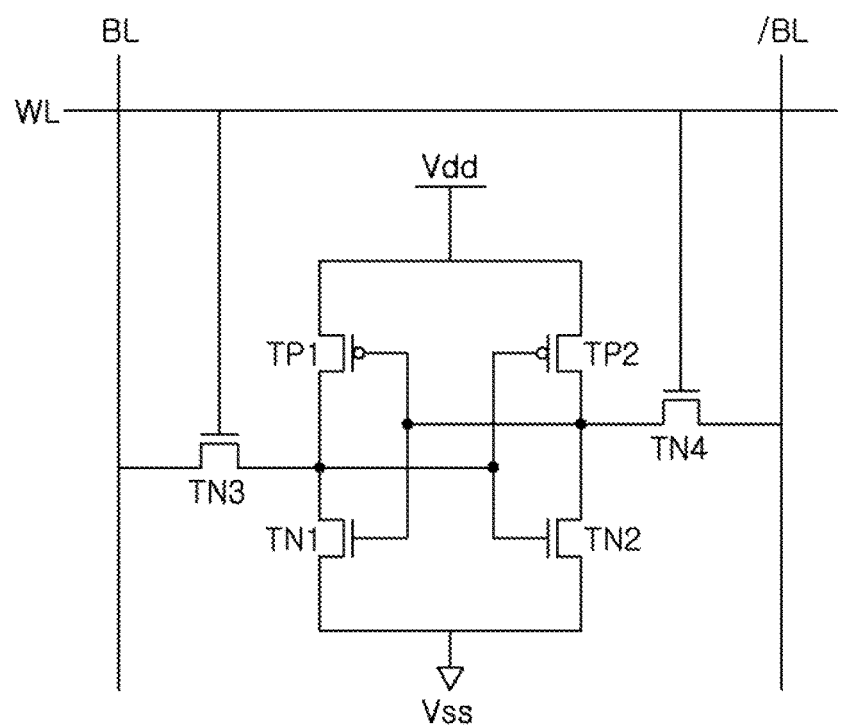
FIG. 15 is a circuit diagram of a static random access memory (SRAM) cell, including the semiconductor device, according to an example embodiment of the present disclosure.

FIG. 15 is a circuit diagram of a static random access memory (SRAM) cell according to an example embodiment of the present disclosure.

Referring to FIG. 15, in a SRAM device, a single SRAM cell may be configured of first and second driving transistors TN1 and TN2, first and second load transistors TP1 and TP2, and first and second access transistors TN3 and TN4. In this example, sources of the first and second driving transistors TN1 and TN2 may be connected to a ground voltage line Vss and sources of the first and second load transistors TP1 and TP2 may be connected to a power supply voltage line Vdd.

Further, the first driving transistor TN1 formed of an NMOS transistor and the first load transistor TP1 formed of a PMOS transistor may configure a first inverter, and the second driving transistor TN2 formed of an NMOS transistor and the second load transistor TP2 formed of a PMOS transistor may configure a second inverter. The first and second load transistors TP1 and TP2 formed of PMOS transistors may be one of the semiconductor devices 100A, 100B, 300A, and 300B according to the foregoing example embodiments of the present disclosure.

Output terminals of the first and second inverters may be connected to sources of the first and second access transistors TN3 and TN4. In addition, input and output terminals of the first and second inverters may intersect with each other and be connected to each other. In addition, drains of the first and second access transistors TN3 and TN4 may be connected to first and second bit lines BL and /BL, respectively.

Figure 16:
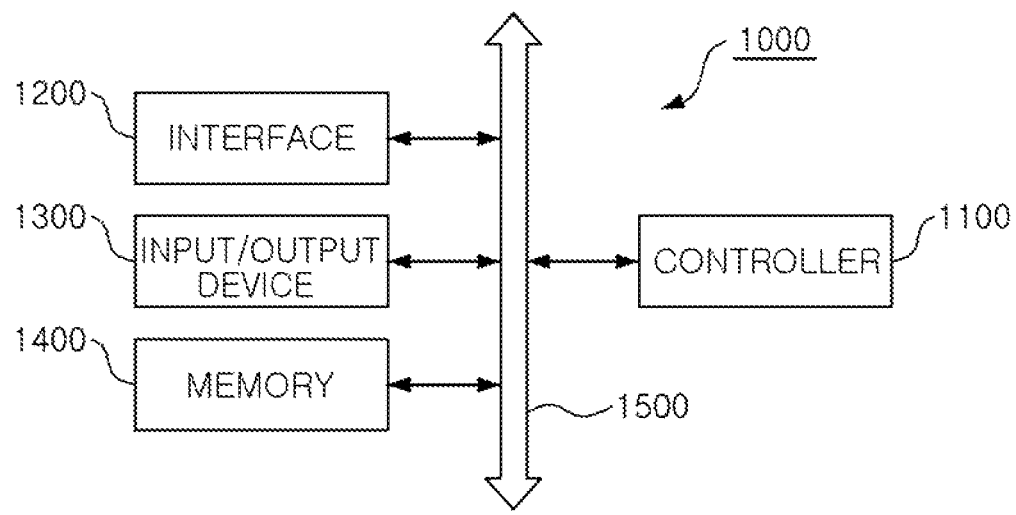
FIGS. 16 and 17 are block diagrams illustrating an electronic apparatus and a storage apparatus, including the semiconductor device, according to an example embodiment of the present disclosure.
Figure 17:
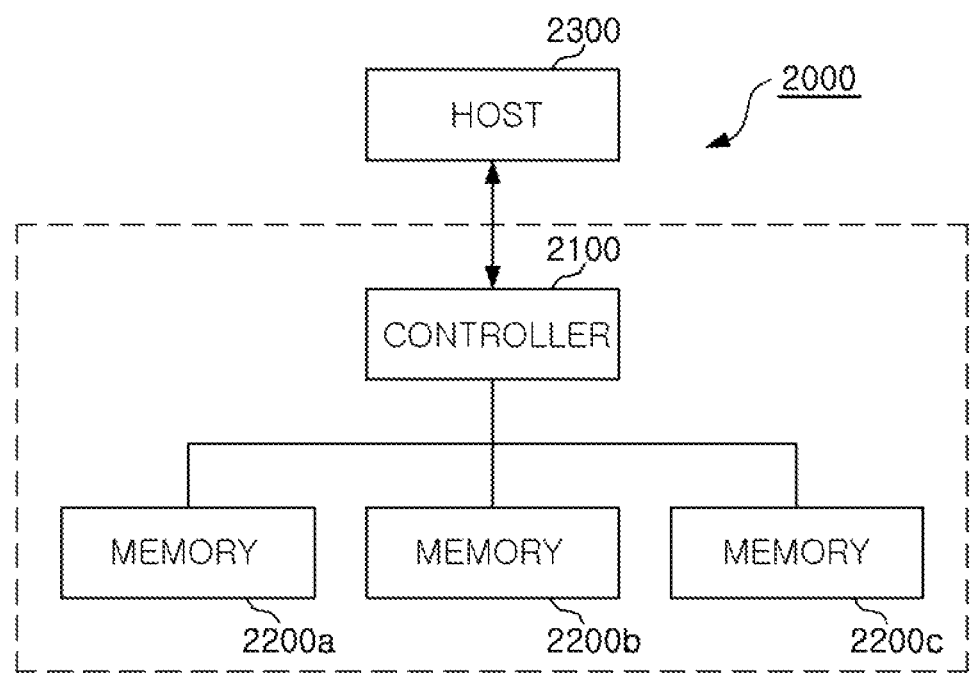

FIGS. 16 and 17 are block diagrams illustrating an electronic apparatus and a storage apparatus according to an example embodiment of the present disclosure.

Referring to FIG. 16, an electronic apparatus 1000 including the semiconductor device according to an example embodiment of the present disclosure may include a controller 1100, an interface 1200, an input/output device 1300, a memory 1400, and the like. The controller 1100, the interface 1200, the input/output device 1300, the memory 1400, and the like may be connected to one another via a bus 1500 providing a path on which data is transferred.

The controller 1100 may include at least one device such as a microprocessor, a digital signal processor, a microcontroller and the like. The memory 1400 may include a device capable of reading and writing data in various manners, and the controller 1100 and the memory 1400 may include at least one of the semiconductor devices 100A, 100B, 300A, and 300B according to the foregoing example embodiments of the present disclosure.

The input/output device 1300 may include a keypad, a keyboard, a touch screen device, a display device, an audio input/output module and the like. The interface 1200 may be a module transmitting and receiving data over a communications network, and examples thereof may include an antenna, a wired or wireless transceiver and the like. In addition to components illustrated in FIG. 16, the electronic apparatus 1000 may further include an application chipset, an image capturing device and the like. The electronic apparatus 1000 illustrated in FIG. 16 is not limited in terms of the category thereof. Examples of the electronic apparatus 1000 may include various apparatuses such as a personal digital assistant (PDA), a portable computer, a mobile phone, a walkie-talkie, a laptop computer, a memory card, a portable media player, a tablet PC and the like.

Referring to FIG. 17, a storage apparatus 2000 according to an example embodiment of the present disclosure may include a controller 2100 communicating with a host 2300, and memories 2200a, 2200b and 2200c storing data. The controller 2100 and the respective memories 2200a, 2200b and 2200c may include at least one of the semiconductor devices 100A, 100B, 300A, and 300B according to the foregoing example embodiments of the present disclosure.

Examples of the host 2300 communicating with the controller 2100 may include various electronic apparatuses on which the storage apparatus 2000 is mounted. For example, the host 2300 may be, for example, a smartphone, a digital camera, a desktop computer, a laptop computer, a media player and the like. The controller 2100 may receive a data writing or data reading request transferred from the host 2300 to store data in the memories 2200a, 2200b and 2200c or generate a command (CMD) for retrieving data from the memories 2200a, 2200b and 2200c.

As set forth above, according to example embodiments of the present disclosure, in forming an embedded silicon germanium (eSiGe) epitaxial layer in a source region and a drain region, a layer containing germanium (Ge) and boron (B) at a high concentration may not be disposed on an uppermost portion of the silicon germanium (eSiGe) epitaxial layer, whereby a loss to the layer containing germanium (Ge) and boron (B) at a high concentration during the formation of a contact plug may be reduced, and thus uniaxial compressive strain may be effectively caused in a channel region. Further, contact resistance may be decreased. Therefore, a high-performance PMOS field effect transistor may be provided.

While example embodiments have been shown and described above, it will be apparent to those skilled in the art that modifications and variations could be made without departing from the spirit and scope of the present disclosure as defined by the appended claims. For example, although the above embodiments related to PMOS transistors and their formation, alternative embodiments also contemplate NMOS transistors and their formation. In these alternatives, the source region SR and drain region DR (source/drain regions) may be formed by epitaxially growing SiC to induce a tensile strain in a silicon channel region of the NMOS transistor. The source/drain regions may have similar structure to that described above, except that a carbon concentration is varied with respect to adjacent epitaxial layers of the source/drains rather than germanium. It will also be appreciated that the NMOS transistor may be implemented with a p-type doped channel region. In other alternatives, materials other than SiGe, SiC and Si may be used to form PMOS and NMOS transistors so as to provide strained channel transistors with source/drain regions having varied ratios/concentrations of semiconductor materials as described herein.

What is claimed is:
1. A semiconductor device comprising:
a semiconductor substrate;

a device isolating layer embedded within the semiconductor substrate and defining an active region;
a channel region formed in the active region;
a gate electrode disposed above the channel region;
a gate insulating layer provided between the channel region and the gate electrode;
a silicon germanium epitaxial layer adjacent to the channel region within the active region and including a first epitaxial layer containing a first concentration of germanium, a second epitaxial layer containing a second concentration of germanium, higher than the first concentration, and a third epitaxial layer containing a third concentration of germanium, lower than the second concentration and higher than the first concentration; and
a contact plug disposed on the silicon germanium epitaxial layer,
wherein the contact plug extends into the third epitaxial layer, and
wherein the first to third epitaxial layers are sequentially stacked on one another in that order and the third epitaxial layer is the uppermost layer of the silicon germanium epitaxial layer.

2. The semiconductor device of claim 1, wherein the silicon germanium epitaxial layer further includes a buffer epitaxial layer having a germanium concentration lower than the first concentration, below the first epitaxial layer.

3. The semiconductor device of claim 2, wherein the germanium concentration of the buffer epitaxial layer is in a range of 10 at % to 25 at %.

4. The semiconductor device of claim 2, wherein the silicon germanium epitaxial layer may further include:
a first interfacial layer between the buffer epitaxial layer and the first epitaxial layer;
a second interfacial layer between the first epitaxial layer and the second epitaxial layer; and
a third interfacial layer between the second epitaxial layer and the third epitaxial layer.

5. The semiconductor device of claim 1, wherein the first concentration is in a range of 25 at % to 50 at %, the second concentration is in a range of 50 at % to 90 at %, and the third concentration is in a range of 25 at % to 50 at %.

6. The semiconductor device of claim 1, further comprising:
a metal silicide layer disposed between the silicon germanium epitaxial layer and the contact plug,
wherein the metal silicide layer is positioned in an upper portion of the second epitaxial layer.

7. The semiconductor device of claim 1, wherein the silicon germanium epitaxial layer is doped with a p-type impurity and a concentration of the p-type impurity is varied in the first, second and third epitaxial layers in proportion to the first, second and third concentrations, respectively.

8. The semiconductor device of claim 7, wherein the p-type impurity is boron.

9. The semiconductor device of claim 1, wherein the active region includes a recessed region in a location corresponding to both sides of the gate electrode, and the silicon germanium epitaxial layer is formed in the recessed region of the active region.

10. The semiconductor device of claim 1,
wherein the active region includes a plurality of active layers, and the device isolating layer is provided to fill a space between the plurality of active layers to a predetermined height, and
wherein a width of the active region is reduced in an upward direction and an upper portion of the active region protrudes upwardly above the device isolating layer.

11. The semiconductor device of claim 10, wherein the gate electrode is extended to cross the active region and cover the upper portion of the active region protruding upwardly above the device isolating layer.

12. The semiconductor device of claim 1, wherein the gate insulating layer includes at least one high-k dielectric layer and the gate electrode is at least comprised of one of metal silicide and a metal.

13. The semiconductor device of claim 1, wherein the semiconductor substrate is a monocrystalline, silicon substrate, and the active region is doped with an n-type impurity.

14. The semiconductor device of claim 1, wherein the semiconductor substrate is a silicon-on-insulator (SOI) substrate, and the active region is doped with an n-type impurity.

15. A semiconductor device comprising:
a semiconductor substrate;
a device isolating layer embedded within the semiconductor substrate and defining an active region;
a channel region formed in the active region;
a gate electrode disposed above the channel region;
a gate insulating layer provided between the channel region and the gate electrode;
a silicon germanium epitaxial layer adjacent to the channel region within the active region and including a first epitaxial layer containing a first concentration of germanium, a second epitaxial layer containing a second concentration of germanium, higher than the first concentration, and a third epitaxial layer containing a third concentration of germanium, lower than the second concentration and higher than the first concentration; and
a silicon capping layer and an etch stopping layer,
wherein the silicon capping layer and etch stopping layer are sequentially disposed on the silicon germanium epitaxial layer.

16. The semiconductor device of claim 15, further comprising:
a contact plug disposed on the silicon germanium epitaxial layer,
wherein the contact plug extends into the silicon capping layer, and
a metal silicide layer disposed between a bottom surface of the third epitaxial layer and the contact plug.

17. A semiconductor device comprising:
a semiconductor substrate;
a device isolating layer embedded within the semiconductor substrate and defining an active region;
a channel region formed in the active region;
a gate electrode disposed above the channel region;
a gate insulating layer provided between the channel region and the gate electrode; and
a silicon germanium epitaxial layer adjacent to the channel region within the active region and including a first epitaxial layer containing a first concentration of germanium, a second epitaxial layer containing a second concentration of germanium, higher than the first concentration, and a third epitaxial layer containing a third concentration of germanium, lower than the second concentration and higher than the first concentration,
wherein the first epitaxial layer has a germanium concentration that increases with height and wherein the germanium concentration of the first epitaxial layer is within a range of 10 at % to 50 at %.

* * * * *